(12) United States Patent
Liu et al.

(10) Patent No.: US 8,946,831 B2
(45) Date of Patent: Feb. 3, 2015

(54) LOW FREQUENCY RESPONSE MICROPHONE DIAPHRAGM STRUCTURES AND METHODS FOR PRODUCING THE SAME

(71) Applicant: Invensense, Inc., San Jose, CA (US)

(72) Inventors: Fang Liu, Woburn, MA (US); Kuang L. Yang, Newton, MA (US)

(73) Assignee: Invensense, Inc., San Jose, CA (US)

( * ) Notice: Subject to any disclaimer, the term of this patent is extended or adjusted under 35 U.S.C. 154(b) by 0 days.

(21) Appl. No.: 13/795,861

(22) Filed: Mar. 12, 2013

(65) Prior Publication Data

US 2014/0264650 A1    Sep. 18, 2014

(51) Int. Cl.
*H04R 1/00* (2006.01)
*B81B 3/00* (2006.01)
*B81C 1/00* (2006.01)

(52) U.S. Cl.
CPC ........... *B81B 3/0078* (2013.01); *B81C 1/00682* (2013.01)
USPC ........................................................ 257/414

(58) Field of Classification Search
CPC ..... B81B 3/0035; G01L 9/0042; H04R 19/04

USPC ........................................................... 257/414
See application file for complete search history.

(56) References Cited

U.S. PATENT DOCUMENTS

| | | |
|---|---|---|
| 5,222,050 A | 6/1993 | Marren et al. |
| 7,329,933 B2 | 2/2008 | Zhe et al. ...................... 257/419 |
| 8,103,027 B2 | 1/2012 | Zhang et al. |
| 2006/0093170 A1 | 5/2006 | Zhe et al. ...................... 381/191 |
| 2009/0180655 A1 | 7/2009 | Tien et al. |
| 2010/0074458 A1 | 3/2010 | Lan et al. |
| 2010/0330722 A1* | 12/2010 | Hsieh et al. ..................... 438/53 |
| 2012/0237073 A1 | 9/2012 | Goida et al. |
| 2013/0177180 A1* | 7/2013 | Bharatan et al. .............. 381/174 |

* cited by examiner

*Primary Examiner* — Thomas L Dickey
(74) *Attorney, Agent, or Firm* — Maryam Imam; IPxLaw Group LLP

(57) ABSTRACT

A microphone system includes a diaphragm suspended by springs and including a sealing layer that seals passageways which, if left open, would degrade the microphone's frequency response by allowing air to pass from one side of the diaphragm to the other when the diaphragm is responding to an incident acoustic signal. In some embodiments, the sealing layer may include an equalization aperture to allow pressure to equalize on both sides of the diaphragm.

20 Claims, 18 Drawing Sheets

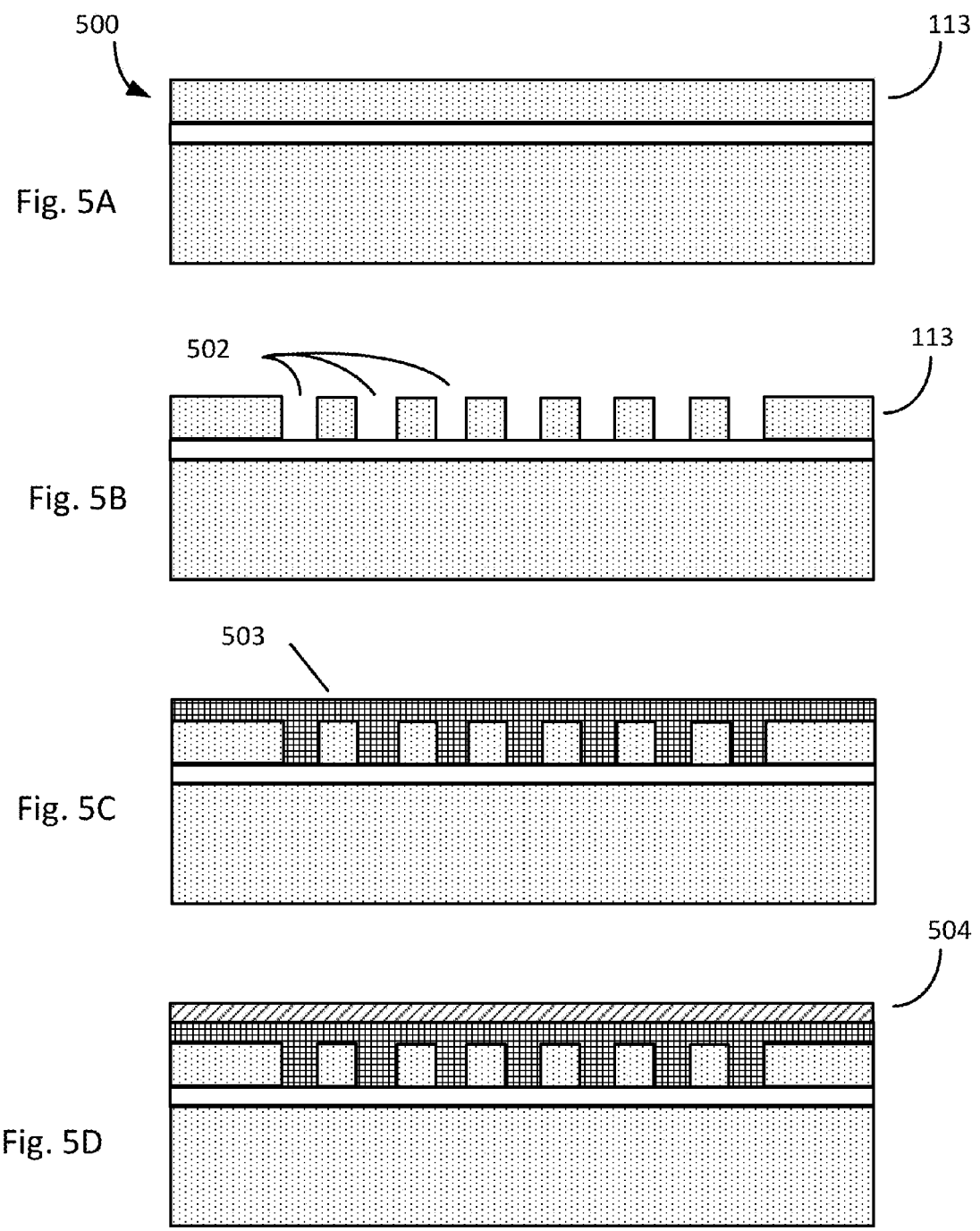

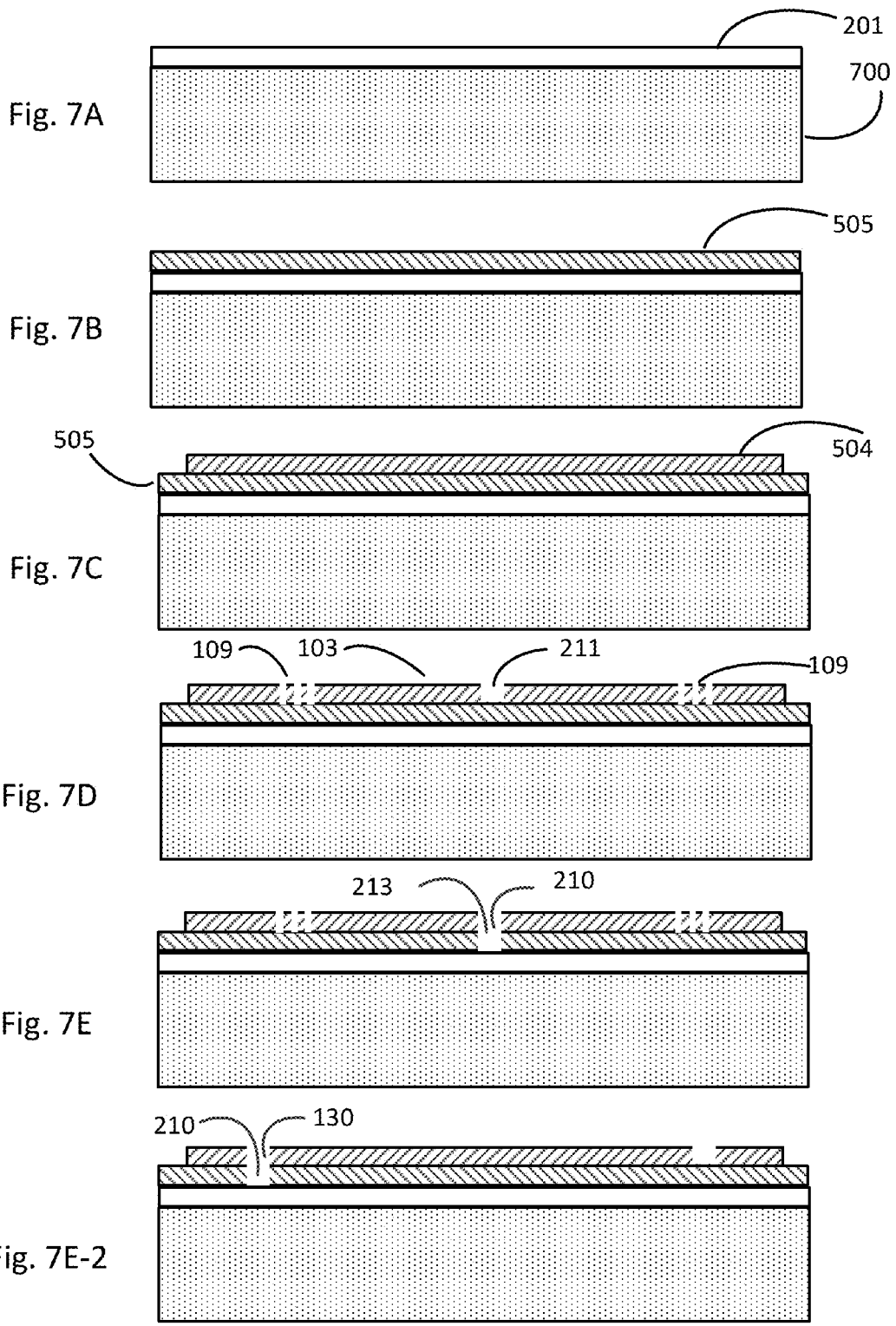

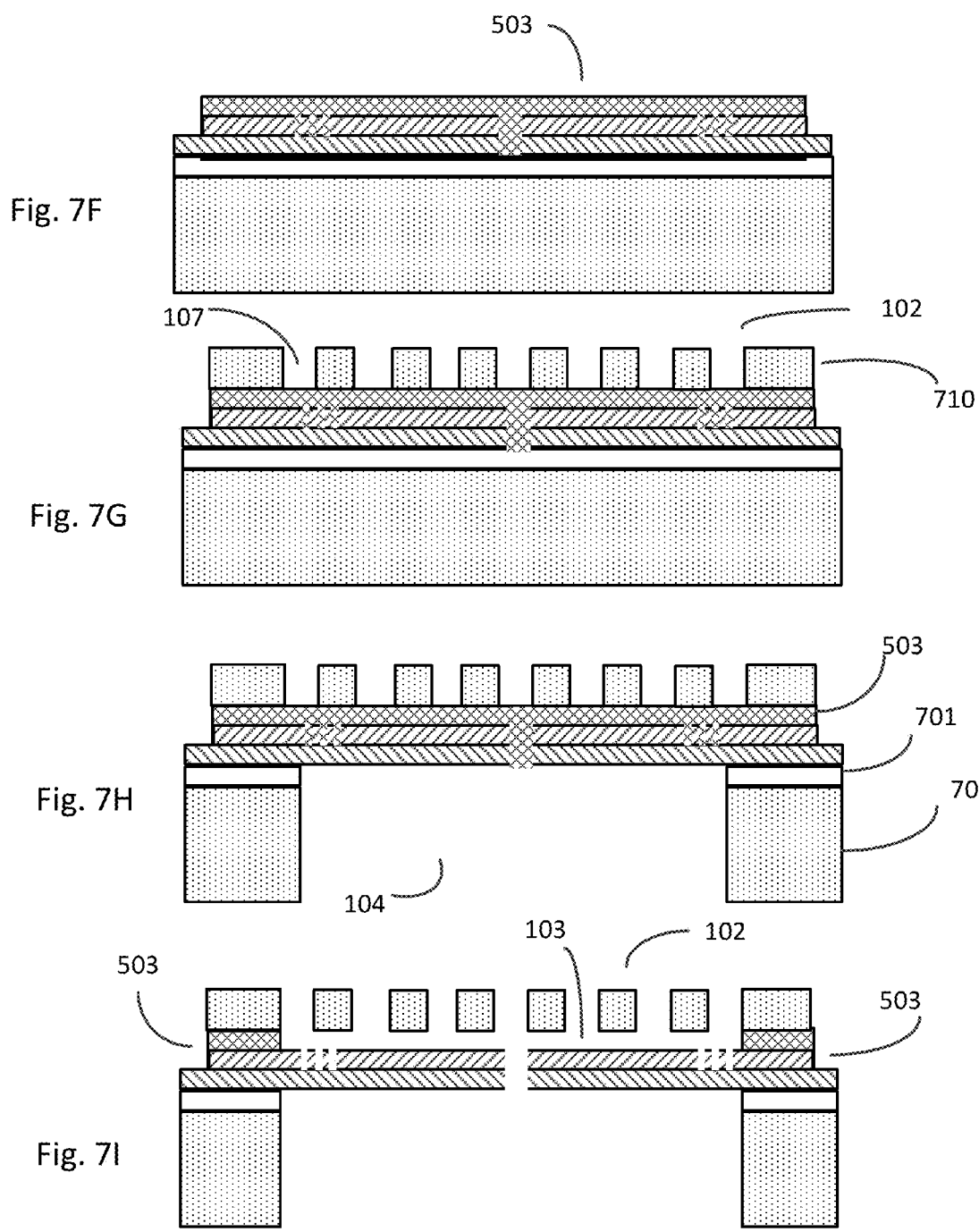

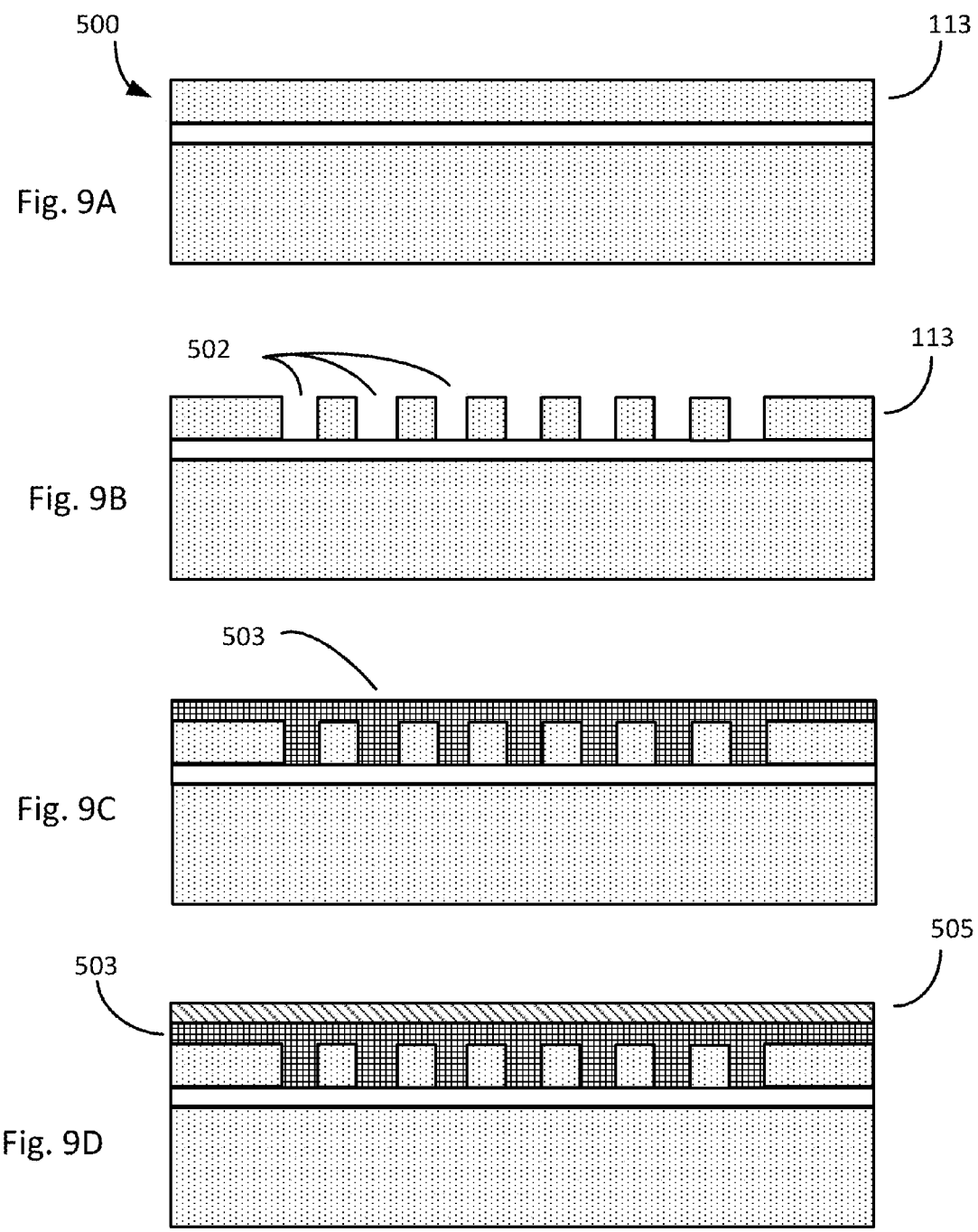

LOW FREQUENCY RESPONSE MICROPHONE DIAPHRAGM STRUCTURES AND METHODS FOR PRODUCING THE SAME

TECHNICAL FIELD

The present invention relates to microphones, and more particularly to diaphragm structures for MEMS microphones.

BACKGROUND ART

A MEMS microphone measures the instantaneous differential pressure between opposing sides of diaphragm. To sense an acoustic wave impinging on a diaphragm, the static pressure on both sides of the moving diaphragm should, ideally, be the same.

In a typical MEMS microphone, springs suspending the diaphragm are patterned in a slot adjacent to the diaphragm (e.g., a gap between the diaphragm and a support structure surrounding the diaphragm), and configured to have the desired spring constant. Portions of the slot not occupied by the patterned springs inherently provide air leakage channels, which allow ambient air to balance the pressure of the diaphragm at both sides. Such channels represent an acoustic short circuit. Indeed, if their impedance is too small, most of the air flows through them and only a fraction of the acoustic energy in the air is imparted to the diaphragm to make the diaphragm move, thereby reducing the sensitivity of the microphone. The impedance of these channels is represented by a resistance, which considers losses due to viscous resistance of air passing through them, and an inductor, which represents the inertial effect of the air mass in the channels. At low frequency the resistance is dominant. So the low frequency response of the microphone is limited by the design of the spring channel slot geometry. Below the low corner frequency, the magnitude response has a significant decay.

The acoustic resistance of the slots (Rslot) is a function of the viscosity of the ambient air ($\eta_{air}$), and the thickness (tslot), length (Lslot) and width (wslot), and may be expressed as the flowing equation:

$$R_{slot} = 12\eta_{air} \frac{t_{slot}}{L_{slot} w_{slot}^3}$$

As such, the acoustic resistance of the slot is proportional to its thickness, and inversely proportional to the length of the slot and the cube of the width of the slot. In a spring based microphone design, the length of the spring slots are hundreds of microns and the width of the slot is about 1 micron. The low corner frequency Flow_corner is calculated by:

$$F_{low\_corner} = \frac{1}{2\pi R_{slot}(C_{diaph} + C_{cavity})}$$

where Cdiaph and Ccavity are the acoustic compliance of diaphragm and package cavity respectively.

As such, lowering a microphones low corner frequency may depend on increasing the acoustic resistance, which in turn depends on controlling the dimensions of the slot. As such, the acoustic performance of prior art MEMS microphones is determined, in part, by limits on the ability of the microphone's fabrication process to make very small slots. In other words, the width and length of the slots (wslot) is determined at least in part by the limits of photolithography and etching methods available for use in fabricating the microphones.

SUMMARY OF THE EMBODIMENTS

In a first embodiment, a MEMS microphone includes a substrate having a plurality of diaphragm suspension points; a backplate; a diaphragm having a top side and an opposing bottom side, the diaphragm defining a diaphragm plane, the diaphragm separated from the plurality of diaphragm suspension points by a spring gap in the diaphragm plane; a plurality of springs within the diaphragm plane and within the spring gap, each of the plurality of springs coupled to the diaphragm and to a corresponding one of the plurality of diaphragm suspension points, such that the diaphragm is movably suspended from the plurality of diaphragm suspension points when the microphone is in operation, and such that the diaphragm is spaced from the backplate by a variable diaphragm gap; and a sealing layer laminated on the diaphragm and spanning the spring gap, wherein the backplate and diaphragm form a variable capacitor of a microphone.

Some embodiments have an equalization aperture to allow equalization of ambient (or static) pressure on the top and bottom of the diaphragm. An equalization aperture may have a variety of shapes and cross-sections, depending on the desired acoustic resistance. For example, in some embodiments the sealing layer further includes an equalization aperture configured to allow air flow from the top side of the diaphragm to the bottom side of the diaphragm, the equalization aperture having a cross-section in the plane of the diaphragm of not greater than 20 square micrometers. In some embodiments, the equalization aperture is disposed adjacent the spring gap, such air may flow from the top side of the diaphragm to the bottom side of the diaphragm through the spring gap. In other embodiments, the diaphragm includes a diaphragm aperture extending from the top side of the diaphragm to the bottom side of the diaphragm; and the equalization aperture is aligned with the diaphragm aperture, such that air may flow from the top side of the diaphragm to the bottom side of the diaphragm through the diaphragm aperture.

In some embodiments, the backplate is in the substrate, and the diaphragm is suspended parallel to the substrate. In other embodiments, the diaphragm is on the substrate, and the backplate is suspended parallel to the substrate.

A packaged microphone includes a package base; a package lid coupled to the package base, the package lid and package base forming an interior cavity, one of the package base and the package lid includes an acoustic aperture; a microphone mounted within the interior cavity. The microphone includes a substrate having a backside cavity and a plurality of diaphragm suspension points, the backside cavity spanning the acoustic aperture; a backplate suspended from the substrate and spanning the backside cavity; a diaphragm region having a diaphragm suspended from the diaphragm suspension points, the diaphragm parallel to the backplate and spaced from the backplate by a variable diaphragm gap and separated from the plurality of diaphragm suspension points by a spring gap; and a sealing layer laminated on the diaphragm and spanning the spring gap, such that the backplate and diaphragm form a variable capacitor of a microphone.

In some packaged microphones, the sealing layer completely seals the diaphragm region, and the microphone is mounted to the package base, while in other embodiments the microphone is mounted to the package lid. In either case, one of the package base and the lid includes an equalization aperture. In other words, in various embodiments, the package lid includes the equalization aperture, while in other embodiments, the package base includes the equalization aperture.

In some embodiments, the sealing layer includes an equalization aperture in fluid communication with a passage through a diaphragm region, such that air may flow from one side of the diaphragm to another to equalize pressure on the diaphragm. In some embodiments, the passage is a spring gap, while in other embodiments the passage is a diaphragm aperture.

A method of fabricating a microphone having a sealing layer, includes providing a substrate wafer having a surface; etching trenches into the surface of the substrate wafer; covering the surface of the substrate with a sacrificial material, the sacrificial material filling the trenches; depositing a diaphragm layer on the sacrificial material; etching a spring gap and springs into the diaphragm layer; adding additional sacrificial material within the spring gap such that the additional sacrificial material is contiguous with the sacrificial material; adding a sealing layer on the diaphragm, springs and added sacrificial material; etching a seal aperture in the sealing layer; etching a backside cavity in the substrate wafer to expose the sacrificial material; and removing the sacrificial material and the added sacrificial material to release the diaphragm such that the diaphragm is suspended by the springs and is movable relative to the backplate.

In some embodiments, the method further includes etching a diaphragm aperture through the diaphragm, and the step of adding additional sacrificial material within the spring gap further includes adding additional sacrificial material within the diaphragm aperture such that the additional sacrificial material within the diaphragm aperture is contiguous with the sacrificial material. In some embodiments, the step of etching a seal aperture in the sealing layer includes etching a seal aperture in the sealing layer such that the seal aperture is in fluid communication with the diaphragm aperture after the step of removing the sacrificial material and additional sacrificial material.

In some embodiments, the step of etching a seal aperture in the sealing layer includes etching a seal aperture in the sealing layer such that the seal aperture is in fluid communication with the spring gap after the step of removing the sacrificial material and additional sacrificial material.

In another embodiment, a method of fabricating a microphone having a sealing layer, includes providing a substrate wafer having a surface; etching trenches into the surface of the substrate wafer; covering the surface of the substrate with a sacrificial material, the sacrificial material filling the trenches; depositing a seal layer on the sacrificial material, the seal layer having a thickness of not greater than 500 nanometers; etching a seal aperture in the seal layer; adding additional sacrificial material within the seal aperture such that the additional sacrificial material is contiguous with the sacrificial material; depositing a diaphragm layer on the seal layer; etching a spring gap and springs into the diaphragm layer to define a diaphragm region in the diaphragm layer; etching a backside cavity in the substrate wafer to expose the sacrificial material; and removing the sacrificial material and the added sacrificial material to release the diaphragm such that the diaphragm and backplate form a variable capacitor of a microphone and the diaphragm is suspended by the springs and is movable relative to the backplate suspend the diaphragm when the microphone is in operation, and the seal layer seals the diaphragm region except at the location of the seal aperture.

In some microphones, the seal aperture has a cross-section of not greater than 20 square micrometers.

Some embodiments also etch a diaphragm aperture into the diaphragm along with the etching of the spring gap and springs.

In an alternate embodiment, the step of etching the spring gap includes etching the spring gap such that the spring gap is in fluid communication with the seal aperture after the step of removing the sacrificial material and additional sacrificial material.

BRIEF DESCRIPTION OF THE DRAWINGS

The foregoing features of embodiments will be more readily understood by reference to the following detailed description, taken with reference to the accompanying drawings, in which:

FIGS. 5A-5I schematically illustrate a micromachined microphone at various stages of fabrication according to the method of FIG. 4;

FIGS. 7A-7I schematically illustrate a micromachined microphone at various stages of fabrication according to the method of FIG. 6;

FIGS. 9A-9J schematically illustrate a micromachined microphone at various stages of fabrication according to the method of FIG. 8;

DETAILED DESCRIPTION OF SPECIFIC EMBODIMENTS

In various embodiments, a microphone system includes a diaphragm with sealing layer that seals passageways. The passageways, if left open, would degrade the microphone's frequency response by allowing air to pass from one side of the diaphragm to the other when the diaphragm is responding to an incident acoustic signal. The inventors have discovered that such structures improve microphone performance as compared to similar microphones without a sealing layer. For example, the low-corner frequency of some microphones has been shown to be improved (i.e., lowered) with microphones having such a sealing layer. As another example, the dynamic range of ribbon microphones has been improved with by including a sealing layer according to various embodiments.

Figure 1A:
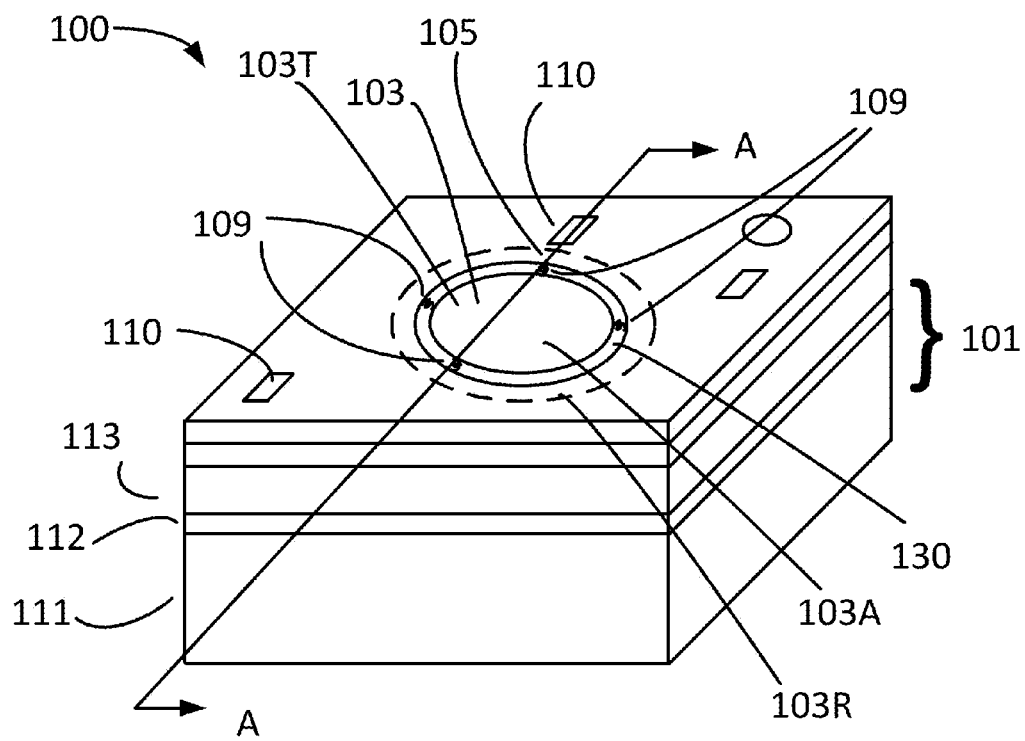
FIGS. 1A-1D schematically illustrate features of an embodiment of a micromachined microphone.
Figure 1B:
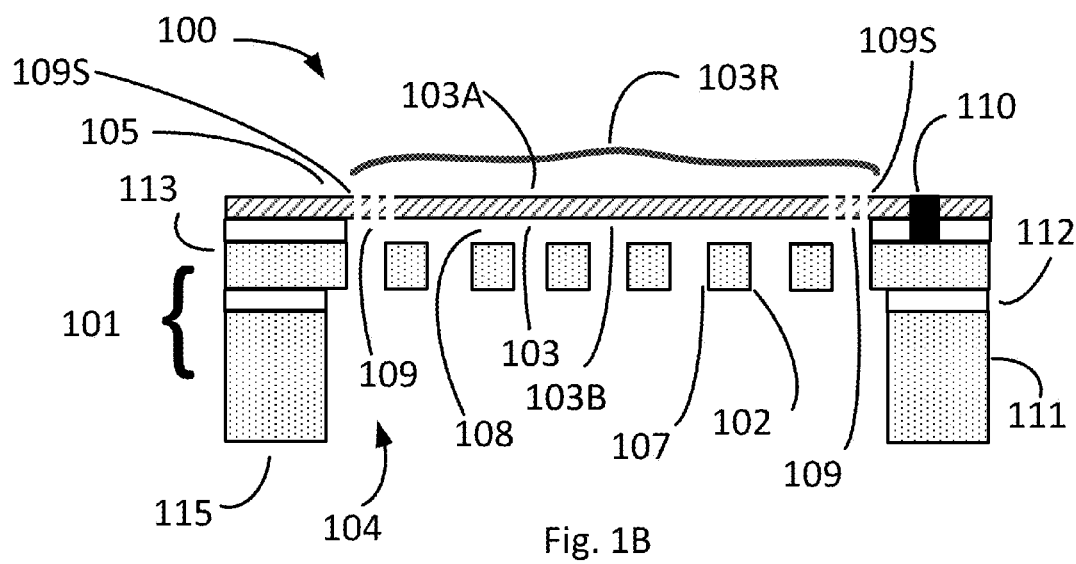

FIG. 1A schematically illustrates a top, perspective view of a MEMS microphone chip 100. FIG. 1B schematically shows a cross-sectional view of the same MEMS microphone chip 100 along section A-A. These figures are discussed to illustrate some exemplary components of a MEMS microphone.

Figure 1C:
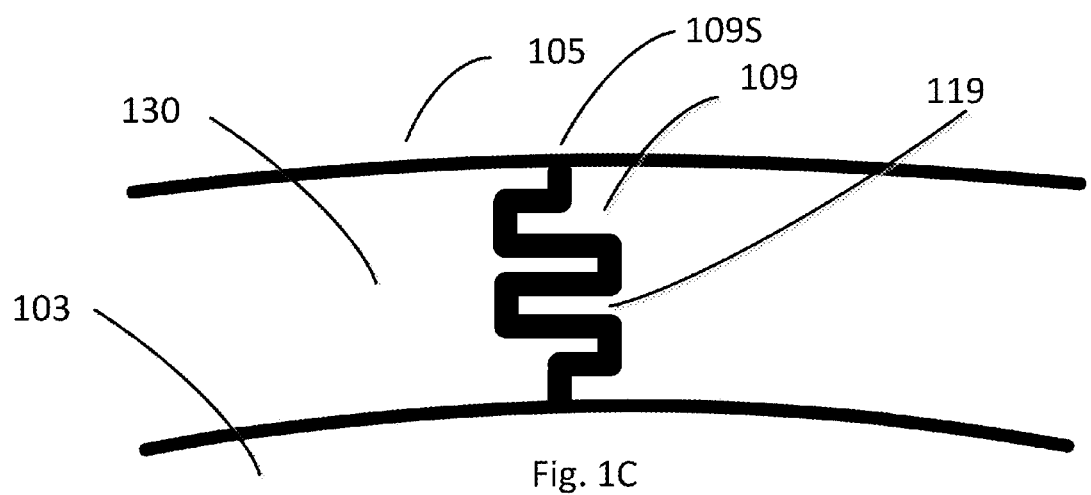

As shown in FIGS. 1A and 1B, the microphone chip 100 has a chip base/substrate 101, a portion of which supports a backplate 102. The microphone 100 also includes a flexible diaphragm 103 that is movable relative to the backplate 102. The diaphragm 103 is suspended by springs 109 in a spring gap 130 between the diaphragm 103 and a surrounding support structure 105 (see FIG. 1C), and the backplate 102 and diaphragm 103 are separated by a gap 108, and together form a variable capacitor across gap 108. Each spring 109 couples to the surrounding support structure 105 at a diaphragm suspension point 109S. In FIG. 1C, the spring 109 is a serpentine spring having a number of finger gaps or spaces 119 between folds of the spring 109, but other spring configurations as known in the art may be used.

As shown in FIGS. 1A and 1B, the region of the microphone 100 near the diaphragm 103 includes a number of passages through which air could pass through the microphone 100 from one side of the diaphragm (e.g., 103A) to the other (e.g., 103B). For example, air could pass through the spring gap 130, including through the spring spaces 119. The region of a microphone, such as microphone 100, that includes the diaphragm and spring gap that would allow air to pass from through the microphone 100 from one side of the diaphragm (e.g., 103A) to the other (e.g., 103B) may be referred to as the "diaphragm region" 103R. For example, in FIG. 1A a diaphragm region 103R is the region enclosed by dashed ellipse.

In some microphones, the backplate 102 is formed from single crystal silicon (e.g., a part of a silicon-on-insulator, or "SOI," wafer, which may be known as the "device layer" 113), while the diaphragm 103 is formed from deposited polysilicon. In other embodiments, however, the backplate 102 and diaphragm 103 may be formed from different materials.

In the embodiment shown in FIG. 1B, the microphone substrate 101 includes the backplate 102 and other structures, such as a bottom wafer 111 and a buried oxide layer 112 of an SOI wafer. A portion of the substrate 101 also forms a backside cavity 104 extending from the bottom 115 of the substrate 101 to the bottom of the backplate 102. To facilitate operation, the backplate 102 has a plurality of through-holes 107 that lead from gap 108 (i.e., a gap between the diaphragm 103 and backplate 102) to the backside cavity 104. As such, the diaphragm 103 is exposed through the backside cavity 104. One or more terminals 110 may electrically couple features of the microphone, such as diaphragm 103 or backplate 102, for example, to circuitry on the MEMS device, or external circuitry.

It should be noted that various embodiments are sometimes described herein using words of orientation such as "top," "bottom," or "side." These and similar terms are merely employed for convenience and typically refer to the perspective of the drawings. For example, the substrate 101 is below the diaphragm 103 from the perspective of FIGS. 1A and 1B. However, the substrate 101 may be in some other orientation relative to the diaphragm 103 depending on the orientation of the MEMS microphone 100. Thus, in the present discussion, perspective is based on the orientation of the drawings of the MEMS microphone 100.

In operation (i.e., when the microphone is transducing an incident acoustic signal), an acoustic signal strikes the diaphragm 103, causing it to vibrate, thus varying the gap 108 between the diaphragm 103 and the backplate 102 to produce a changing capacitance. As such, when sensing an incident acoustic signal, the diaphragm 103 is suspended by the springs 109 and may generally move in a plunger-like motion, in which the diaphragm 103 remains parallel to the backplate 102 as it moves towards, or recedes from, the backplate 102.

Figure 1D:
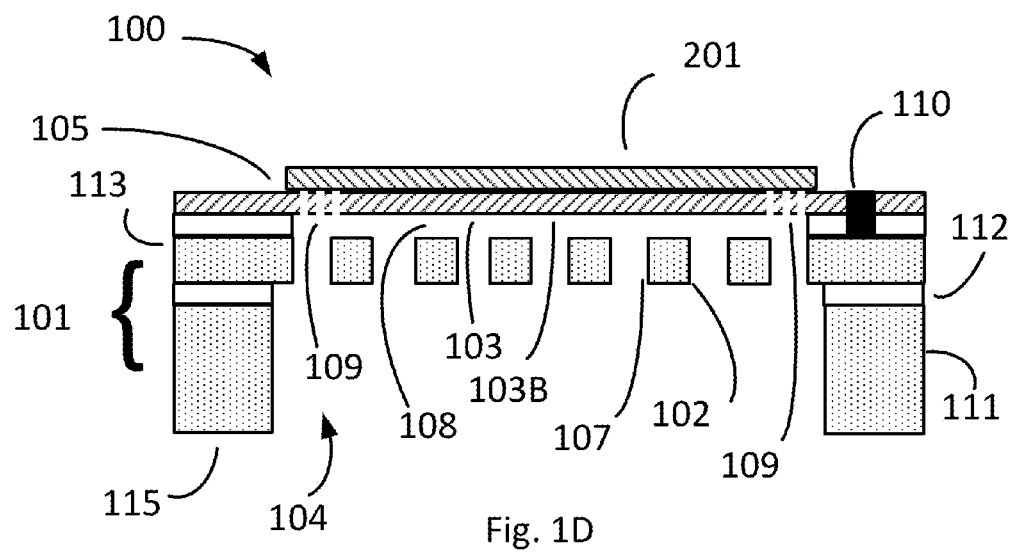

To increase the acoustic resistance of the diaphragm and springs, microphone 100 includes a sealing layer 201 as schematically illustrated in FIG. 1D, which spans the spring gap 130 such that no air may pass from one side of the diaphragm 103 to the other through the spring gap 103. The sealing layer 201 of microphone 100 is not schematically illustrated in FIGS. 1A-1C for the purpose of clarity. The diaphragm 103 and sealing layer 201 provide the acoustic resistance of a drum-head diaphragm, but with the flexibility and plunger-like motion of a spring-suspended diaphragm.

Because the diaphragm 103 and diaphragm region 103R have no other apertures, the sealing layer essentially prevents air from passing from one side of the diaphragm 103 to the other through the microphone 100. Of course, air may pass around the microphone 100, or if the microphone 100 is disposed in a package, air may enter the package through one or more apertures so as to equalize the pressure no opposing sides of the diaphragm.

It should be noted that the diaphragm is supported by the springs 109, rather than the sealing layer 201. In illustrative embodiments, the sealing layer 201 is thin and pliable, such that it will have minimal impact on the ability of the diaphragm to move in response to an incident acoustic signal. To that end, the sealing layer 201 may be fabricated from a material different than the material from which the springs 109 are fabricated. For example, the seal layer 201 (which may be referred to as a "seal film") may be a conductive or none-conductive thin film, such as SiN (silicon nitride), SiC (silicon carbide), AlN (aluminum nitride), ITO (indium tin oxide), diamond, and polymer, and should have good etch selectivity to a sacrificial material used in the fabrication of a microphone, such that the thin film can withstand the etchant during removal of sacrificial material. The thickness of the seal film 201 may be below about 500 nanometers (500 nm). The compliance of the diaphragm 103 is proportional to cube of the film thickness. The dimensions of the springs 109 supporting of the diaphragm 103 may be designed according to the thickness of the covering seal film 201 to achieve the desired bi-layer diaphragm compliance.

Figure 2A:
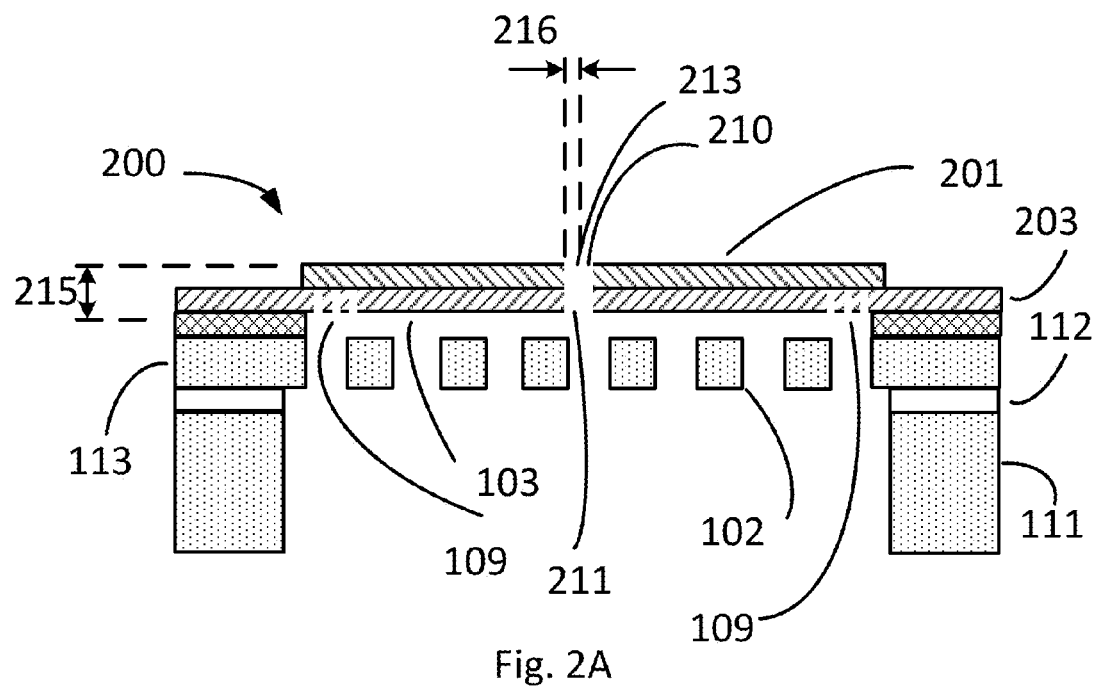
FIG. 2A schematically illustrates an embodiment of a microphone with a sealing layer.

FIG. 2A schematically illustrates another embodiment of a MEMS microphone 200 having a seal layer 201 on the diaphragm 103. The sealing layer 201 extends across the spring gap 130 so as to completely seal the spring gap 130. In some embodiments, the sealing layer even covers a surface of the spring 109. In other words, no air can pass through the spring gap 130 because the entire spring gap 130 is blocked either by the sealing layer 201, the springs 109, or both.

In the embodiment 200 of FIG. 2A, the sealing layer 201 includes a sealing layer aperture 210 and the diaphragm 103 includes a diaphragm aperture 211 aligned with the sealing layer aperture 210. As used herein, the sealing layer aperture 210 and the diaphragm aperture 211 are aligned to form an equalization aperture 213, such that air can pass completely through the diaphragm 103 by passing through the sealing layer aperture 210 and the diaphragm aperture 211. In other words, the aperture 210 and the diaphragm aperture 211 are in fluid communication with each other. As such, the sealing layer aperture 210 and the diaphragm aperture 211 form a small equalization aperture 213 by which air pressure on the opposing faces of the diaphragm (top diaphragm face 103T and bottom diaphragm face 103B) can equalize.

Although the microphone 200 includes an equalization aperture 213, other embodiments (e.g., microphone 100 in FIG. 1B) may not have such equalization apertures. For example, some MEMS microphones may be enclosed in a package, which package includes vents to allow the pressure on both sides of the diaphragm to equalize, even in the absence of an equalization aperture.

Returning to FIG. 2A, the equalization aperture 213 may have a diameter of about 1 micron. Such a small hole will have a high resistance to the flow of ambient air so as to impede the flow of acoustic energy from an impinging acoustic signal, but allow air to flow to equalize pressure on opposing sides of the diaphragm. For example, the air flow through such an equalization aperture 213 may be expressed as:

$$R_{hole} = 8\eta_{air} \frac{t_{hole}}{\pi r_{hole}^4}$$

where ηair (or "nair") is the viscosity of air, thole is the thickness 215 of the equalization aperture 213 (i.e., through both the diaphragm 103 and the sealing layer 201) and rhole is the radius 216 of the equalization aperture 213.

In microphone 200 of FIG. 2A, the equalization aperture 213 has a circular cross-section (e.g., in a plane parallel to the diaphragm layer 203) and is at the center of the diaphragm 103. However, in other embodiments, an equalization aperture 213 may have a variety of shapes and sizes. For example, in some embodiments, the radius of the equalization aperture 213 may range from 1 um to 100 um for example. Also, the shape of the equalization aperture 213 may be a rectangle or other polygon.

Figure 2B:
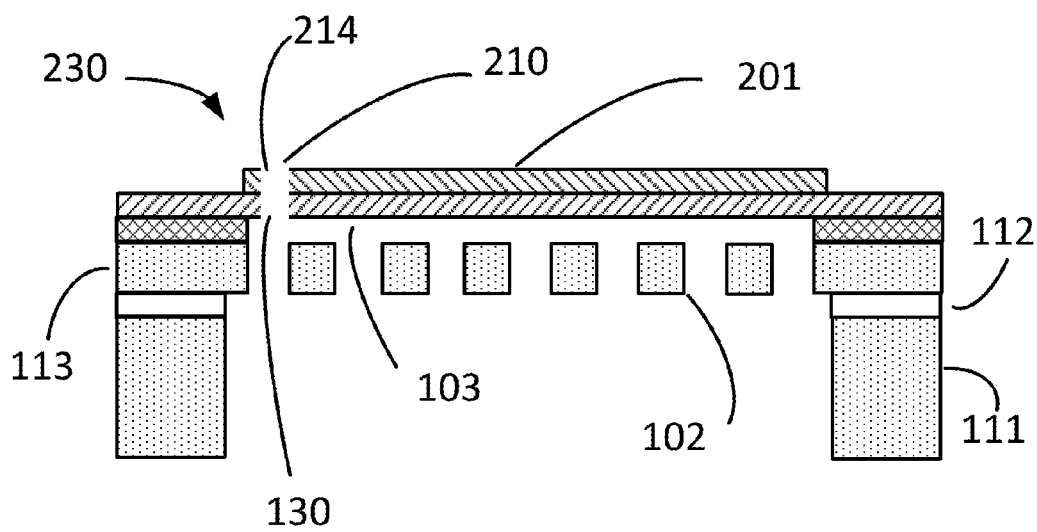
FIG. 2B schematically illustrates an alternate embodiment of a microphone with a sealing layer.

In addition, the equalization aperture 213 may be located in a variety of locations. Indeed, in the embodiment 230 of FIG. 2B, the equalization aperture 213 passes through the sealing layer at the spring gap, so that air may pass through the equalization aperture 213 in the sealing layer and through the spring gap, without passing through an aperture in the diaphragm.

Figure 2C:
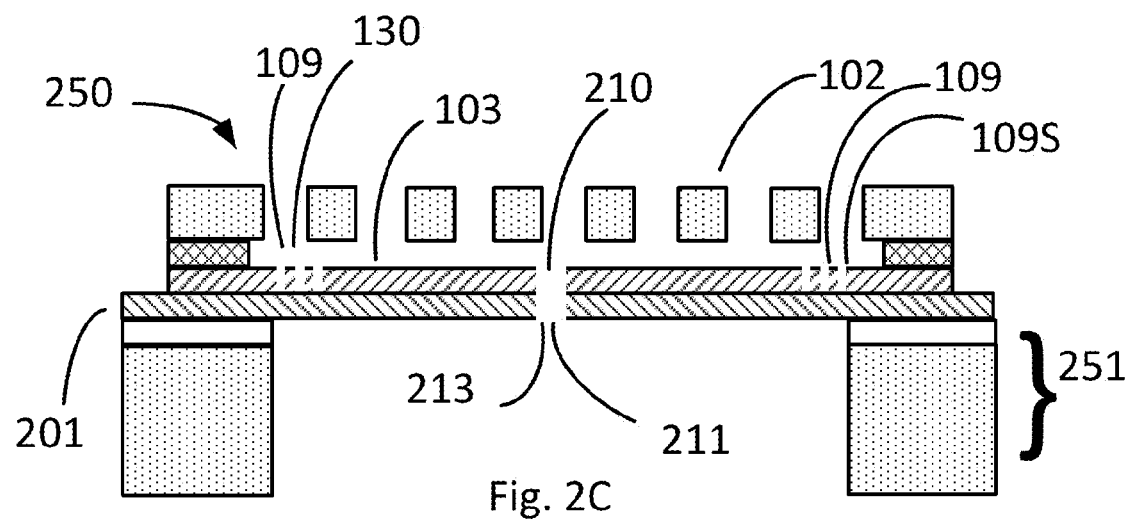
FIG. 2C schematically illustrates an alternate embodiment of a microphone with a sealing layer.

Another embodiment of a MEMS microphone 250 is schematically illustrated in FIG. 2C, in which the diaphragm 103 is suspended from diaphragm suspension points 109S by springs 109, and the backplate 102 is supported above the substrate 251. In microphone 250, the equalization aperture 213 is in the diaphragm, similar to the equalization aperture in microphone 200 in FIG. 2A. The substrate 251 may be a silicon-on-insulator wafer, or may by a different substrate on which various layers are disposed in the construction of the microphone 250.

Figure 2D:
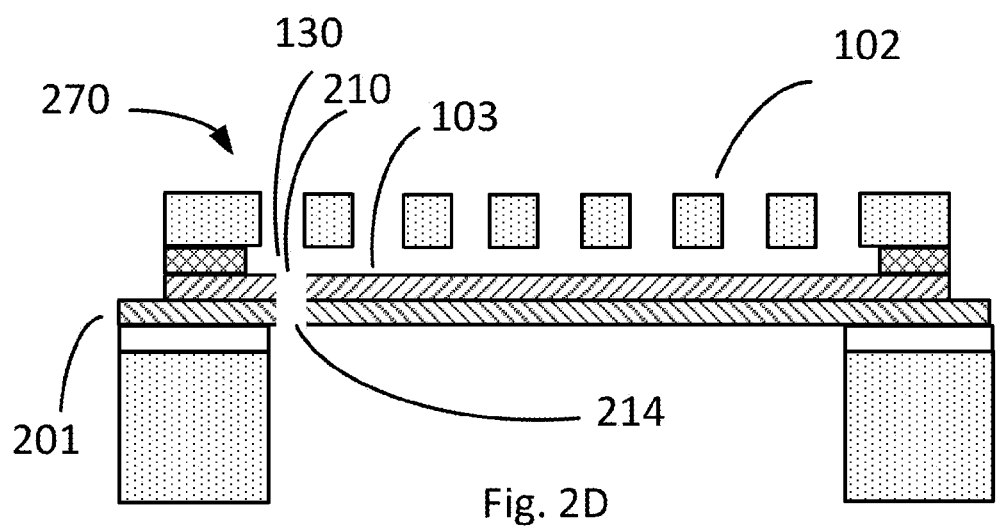
FIG. 2D schematically illustrates an alternate embodiment of a microphone with a sealing layer.

Another embodiment of a MEMS microphone 270 is schematically illustrated in FIG. 2D, and is similar to the microphone 250 in FIG. 2C, except that the equalization aperture 214 is not through the diaphragm 103 but is an aperture in the sealing layer 201 adjacent to the spring gap 130.

Figure 2E:
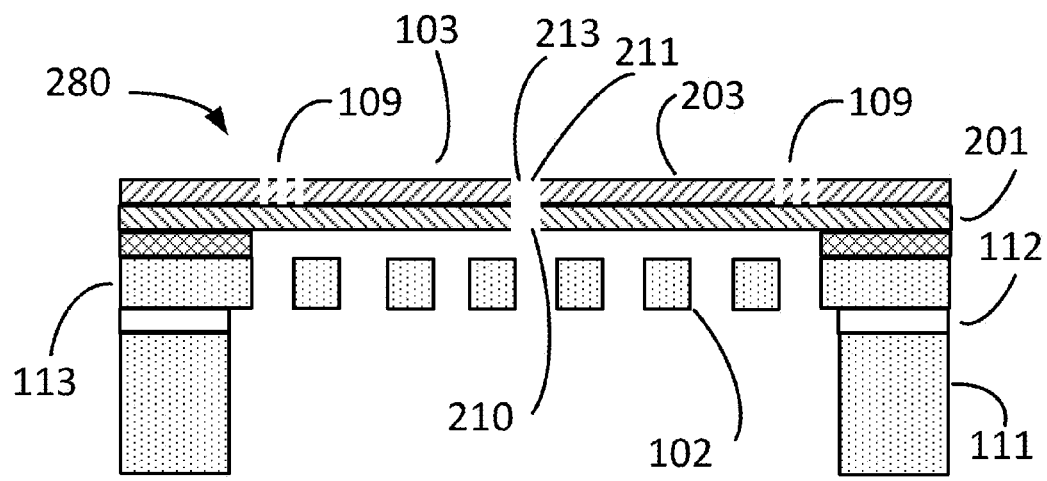
FIG. 2E schematically illustrates an alternate embodiment of a microphone with a sealing layer.
Figure 2F:
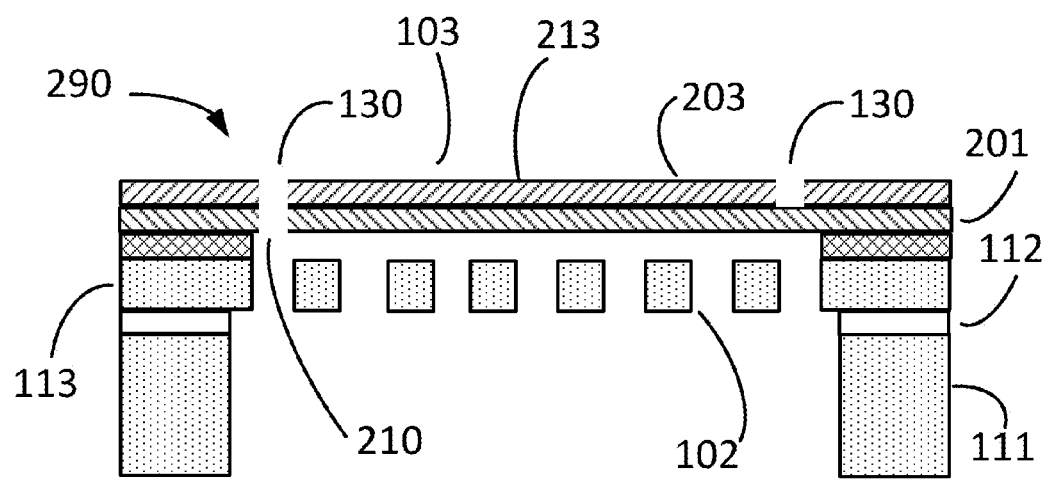
FIG. 2F schematically illustrates an alternate embodiment of a microphone with a sealing layer.

Other embodiments of MEMS microphone 280 and 290 are schematically illustrated in FIG. 2E and FIG. 2F, respectively. Microphones 280 and 290 are similar to microphones 200 and 230 in FIG. 2A and FIG. 2B, except that in microphones 280 and 290, the sealing layer 201 is on the bottom of the diaphragm 103—i.e. the sealing 201 is disposed between the diaphragm 103 and the backplate 102.

Generally, a diaphragm aperture 211 or spring gap 130 may be referred to as "equalization passages" through a diaphragm or diaphragm region. Where an equalization passage (e.g., diaphragm aperture 211 or spring gap 130) is adjacent to a sealing layer aperture 210, such that such that air can pass from one side (e.g., 103A) of the diaphragm 103 to the other (e.g. 103B), the equalization passage is defined as being in fluid communication with the sealing layer aperture 210.

Figure 3A:
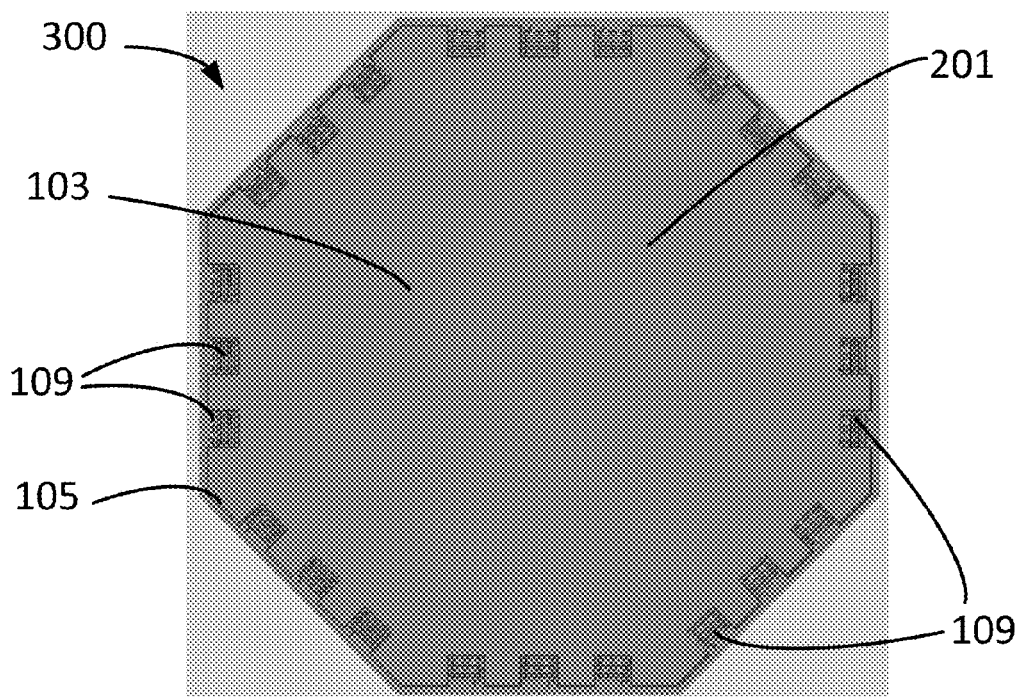
FIGS. 3A and 3B schematically illustrate an embodiment of a microphone with an octagonal diaphragm and a sealing layer.
Figure 3B:
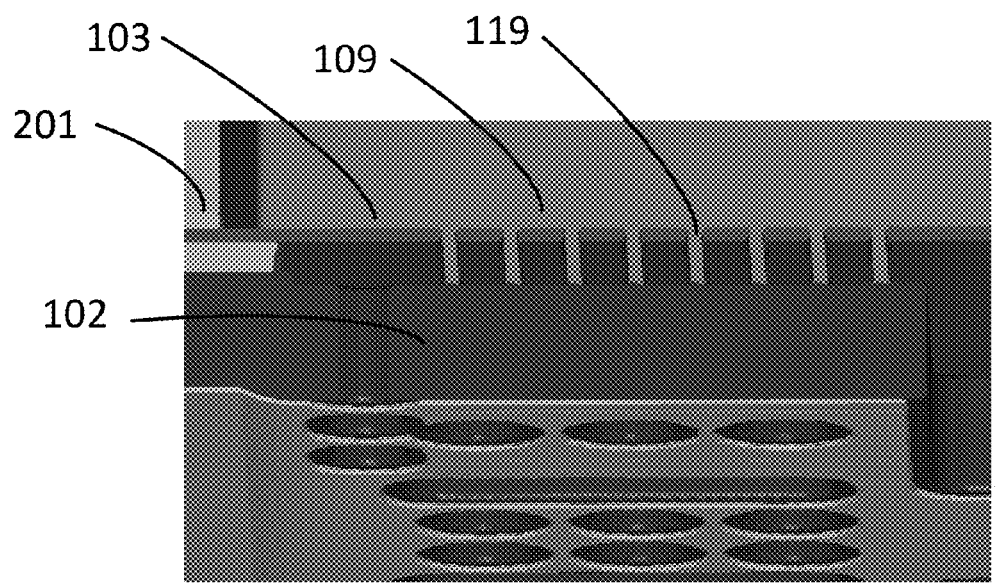

Yet another embodiment of a MEMS microphone 300 is schematically illustrated in FIGS. 3A and 3B. Microphone 300 has an octagonal diaphragm 103 suspended by several serpentine springs 109 in a spring gap 130 between a supporting structure 105 and the diaphragm. FIG. 3A schematically illustrates a bottom side 103B of the diaphragm 103. The surface 103B of the diaphragm 103 is covered with a seal layer 201, except that there is no seal layer over the springs 109.

FIG. 3B schematically illustrates a cross-section of microphone 300 along a spring 109, from the top side 103T of the diaphragm 103. FIG. 3B shows that the spaces 119 within the serpentine spring 109 act, in this embodiment, as air passages for pressure equalization, since the spaces 119 are not blocked by any seal film (201).

Figure 4:
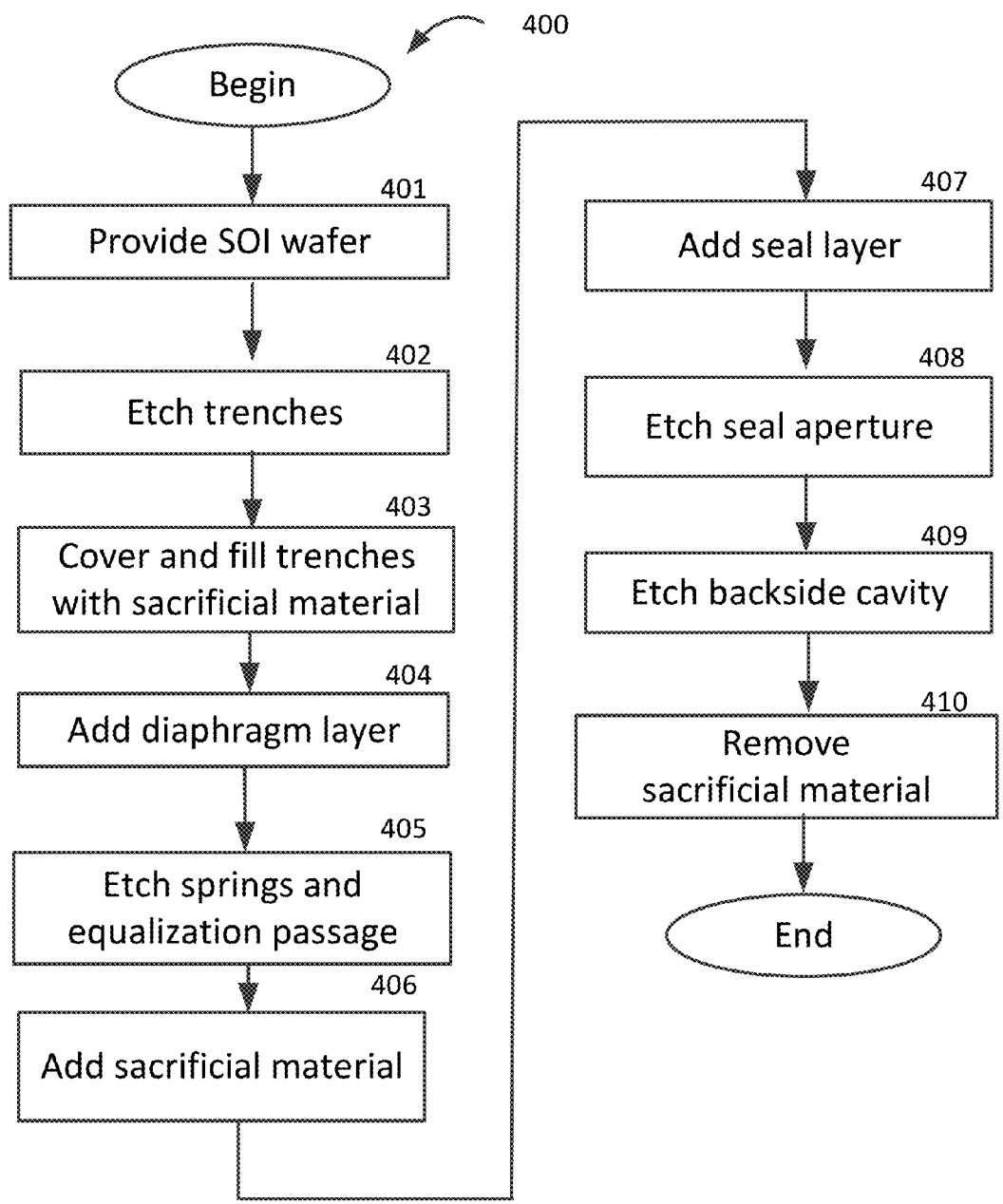
FIG. 4 is a flow chart illustrating a method of fabricating a micromachined microphone with a sealing layer.

A method 400 of fabricating a MEMS microphone with a sealing layer, such as microphone 200, is illustrated by a flow chart in FIG. 4, and such a microphone is shown at various stages of fabrication in FIGS. 5A-5I.

The fabrication process 400 begins by providing a silicon-on-insulator wafer 500 (FIG. 5A; step 401), and then by etching trenches 501 into the device layer 113 of the wafer 500 (FIG. 5B; step 402). The trenches 502 will later be through holes 107 in backplate 102.

At step 403, the method deposits a sacrificial material 503 onto the wafer 500 so as to fill the trenches 502, and cover the remaining portions of the device layer 113 (FIG. 5C). In other words, the device layer 113 and trenches are covered by sacrificial material 503. In some embodiments, the sacrificial material may be an electrical insulator, so as to electrically isolate the diaphragm layer 504 (and ultimately the diaphragm 103) from the backplate 102. For example, the sacrificial material 503 may be an oxide.

Figure 5E:
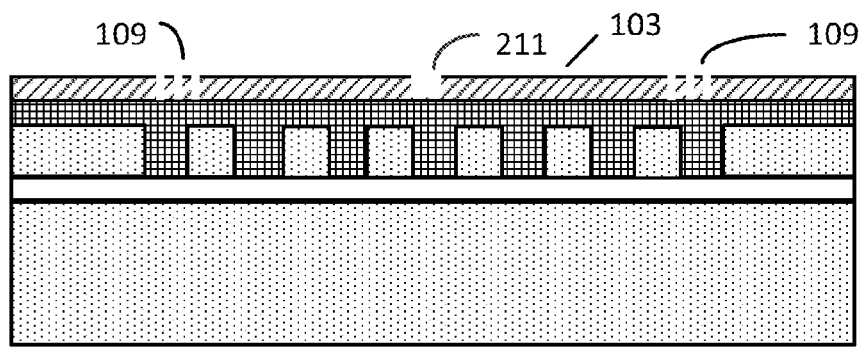
Figure 5F:
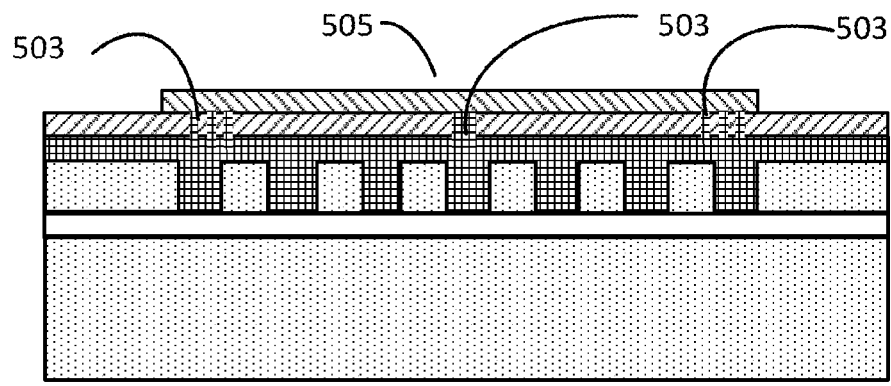

Next, the method 400 deposits a diaphragm layer 504 onto the sacrificial material 503 (FIG. 5D; step 404), and patterns the diaphragm layer 504 to form the diaphragm (103) and springs 109 and spring gap 130 (FIG. 5E; step 405). In some embodiments (e.g., microphone 230), the spring gap will serve as the equalization aperture. In such embodiments, no diaphragm aperture is formed by the method 400. However, if the microphone 200 includes an equalization aperture 113 as an equalization aperture, the method also forms a diaphragm aperture 211 at step 405 (FIG. 5E).

Subsequently, at step 406 (FIG. 5F), the method 400 deposits additional sacrificial material 503 to fill the spring gap (130) and the spaces 119 within the springs 109, and to fill the diaphragm aperture 211 (if any). The additional sacrificial material 503 allows the method 400 to deposit a seal film 505 at step 407 (FIG. 5F) without the seal film filling the spring gap (130) and the spaces 119 within the springs 109, and to fill the diaphragm aperture 211 (if any).

Figure 5G:
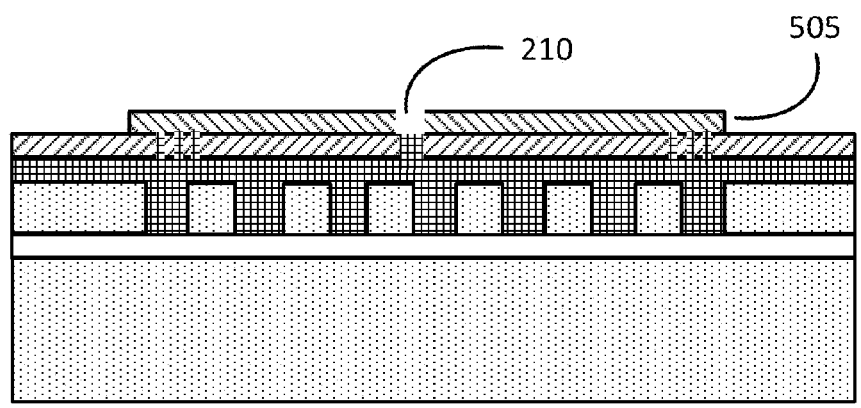
Figures 2, 5G:
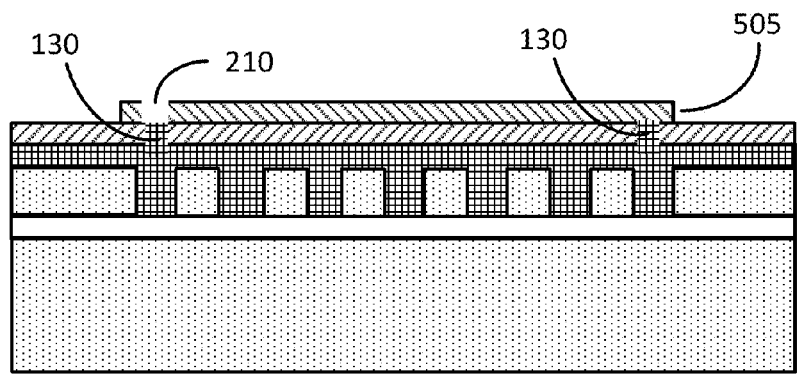

The method 400 then proceeds to etch the seal aperture 210 in seal film 505 (FIG. 5G or FIG. 5G-2; step 408). If the microphone being fabricated has a diaphragm aperture 211, the method etches the seal aperture in a location such that the seal aperture 210 will be in fluid communication with the diaphragm aperture 210 after the sacrificial material 503 is removed as described below (FIG. 5G). If the microphone being fabricated does not include a diaphragm aperture, then the seal aperture 210 may be fabricate in a location such that the seal aperture 210 will be in fluid communication with the spring gap 130 (FIG. 5G-2).

Figure 5H:
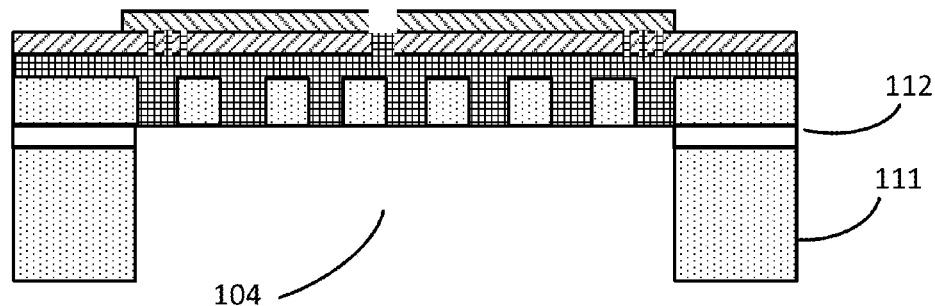

The method 400 also forms a backside cavity 104 through layer 111 and 112 of wafer 500 (FIG. 5H; step 409).

Figure 5I:
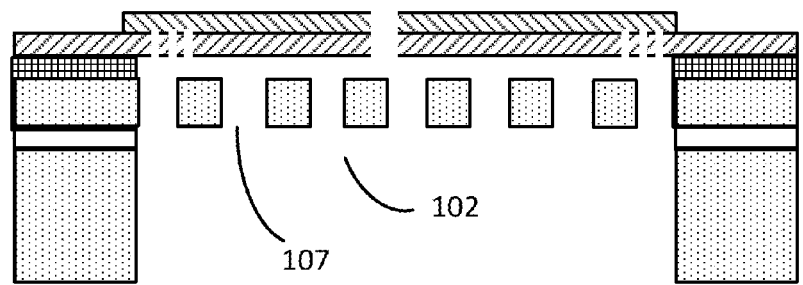

Finally, the sacrificial material 503 (including the additional sacrificial material 503) is removed at step 410 (FIG. 5I). Removal of the sacrificial material 503 includes removal of the all or substantially all of the sacrificial material 503 in the trenches 107, and between the backplate 102 and the diaphragm 103, as well as in the spring gap 130, spring spaces 119, and diaphragm aperture 211. Some of the sacrificial material 503 remains between the device layer 112 and the diaphragm layer 504, and physically couples the device layer 112 and the diaphragm layer 504. As a result, the diaphragm 103 is rendered movable with respect to the backplate 102. In other words, the diaphragm is "released."

Figure 6:
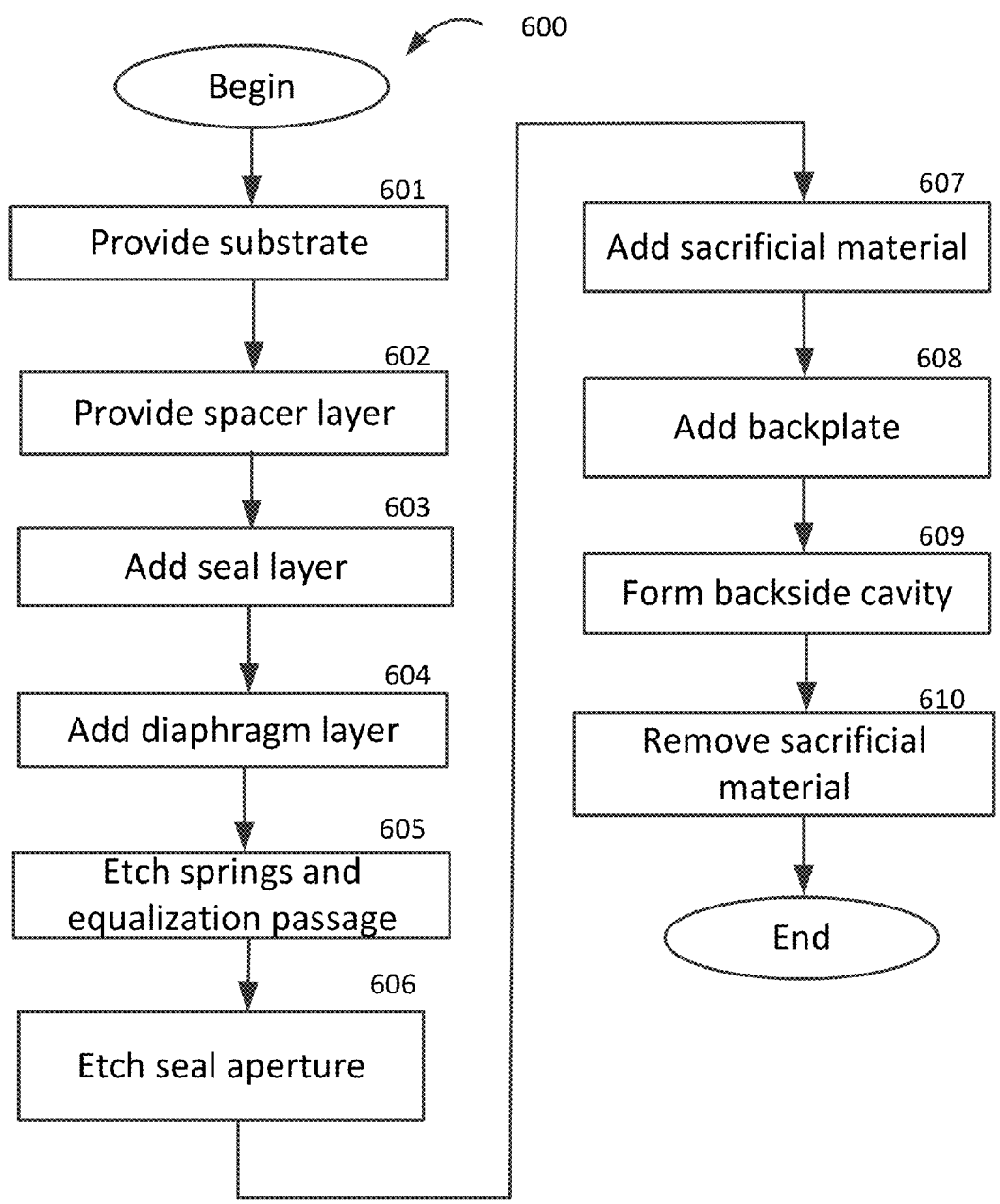
FIG. 6 is a flow chart illustrating a method of fabricating a micromachined microphone with a sealing layer.

A method 600 of forming a microphone, such as microphone 250 in FIG. 2C for example, is illustrated by the flow chart in FIG. 6, and such a microphone is shown at various stages of fabrication in FIGS. 7A-7I.

The process 600 beings by providing a substrate 700 (step 601; FIG. 7A). In some embodiments, the substrate 700 may also include a spacer layer 701, or such a layer may be deposited on the wafer 700 at optional step 602 (FIG. 7A).

The method 600 deposits a sealing film layer 505 on the wafer 700 (either on the wafer 700 or on the spacer layer 701) at step 603 (FIG. 7B). Subsequently the method 600 deposits a diaphragm layer 504 on the seal film layer 505 (step 604), and patterns the diaphragm layer 504 to form the diaphragm (103) and springs 109 and spring gap 130 (FIG. 7D; step 605). If the microphone 250 includes an equalization aperture 113, the method also forms a diaphragm aperture 211 (e.g., an equalization passage) at step 605 (FIG. 7D). If the method 600 is fabricating a microphone without an equalization aperture 213 through the diaphragm 103 (e.g., microphone 230), then no diaphragm aperture 211 is formed at step 405.

Subsequently, the method 600 etches a seal aperture 210 in seal layer 504. For example, the seal layer aperture 210 may be etched through the diaphragm aperture 211 (FIG. 7E; step 606). Alternately, the seal aperture 210 may be etched through the spring gap 130 (FIG. 7E-2).

Sacrificial material 503 is added at step 607, and fills the spring gap 130, spring spaces 119, and equalization aperture 213 (if any) (FIG. 7F). Next, a backplate 102 is added at step 608 (FIG. 7G). Adding the backplate 102 may be a two-step process—first adding a backplate layer 710, and then etching trenches 107.

A backside cavity 104 is etched through the substrate 700, and spacer layer 701 (if any) at step 609 (FIG. 7H). Finally, the sacrificial material 503 is removed at step 610 (FIG. 7I). Removal of the sacrificial material 503 includes removal of the all or substantially all of the sacrificial material 503 in the trenches 107, and between the backplate 102 and the diaphragm 103, as well as in the spring gap 130, spring spaces 119, and diaphragm aperture 211. Some of the sacrificial material 503 remains between the substrate 700 and the backplate layer 710, and physically couples the backplate layer 710 and the substrate 700. As a result, the diaphragm 103 is rendered movable with respect to the backplate 102. In other words, the diaphragm is "released."

Figure 8:
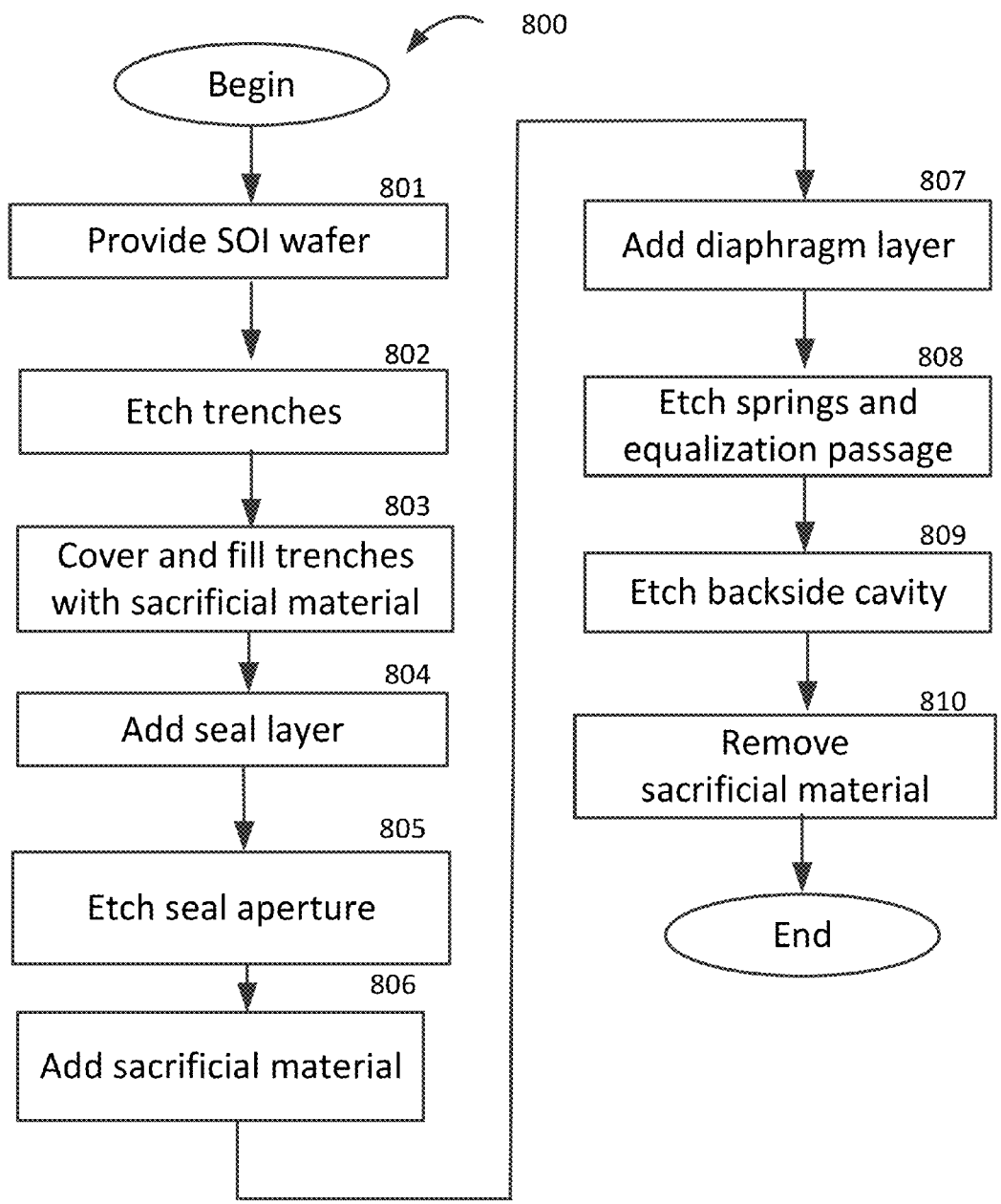
FIG. 8 is a flow chart illustrating a method of fabricating a micromachined microphone with a sealing layer.

A method 800 of fabricating a MEMS microphone with a sealing layer, such as microphone 280 or 290, is illustrated by a flow chart in FIG. 8, and such a microphone is shown at various stages of fabrication in FIGS. 9A-9J.

The fabrication process 800 begins by providing a silicon-on-insulator wafer 500 (FIG. 9A; step 501), and then by etching trenches 501 into the device layer 113 of the wafer 500 (FIG. 9B; step 802). The trenches 502 will later be through holes 107 in backplate 102.

At step 803 (FIG. 9C), the method 800 deposits a layer of sacrificial material 503 onto the wafer 500 so as to fill the trenches 502, and cover the remaining portions of the device layer 113 (FIG. 8C). In other words, the device layer 113 and trenches are covered by sacrificial material 503.

Figure 9E:
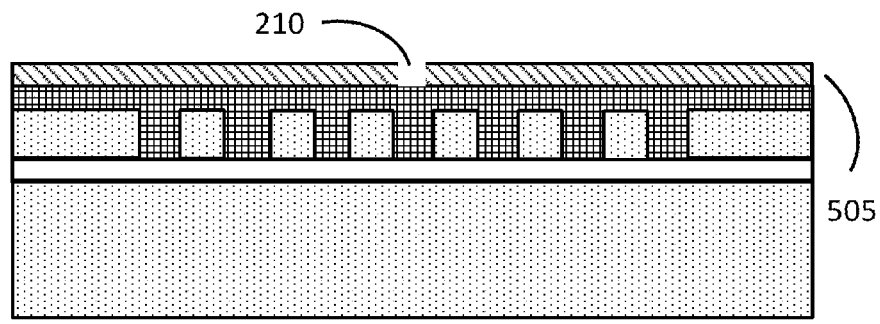
Figures 2, 9E:
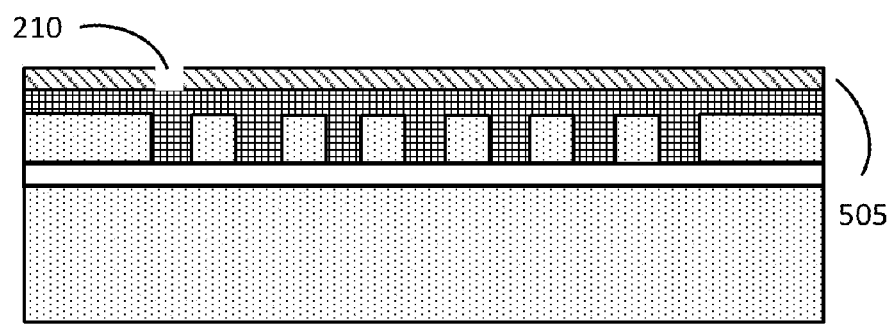

Subsequently, a seal layer 50 is deposited onto the sacrificial layer 503 at step 804 (FIG. 9D). A seal aperture 210 is etched into the seal layer 505 at step 905. The seal aperture 210 is etched in a location at which the seal aperture 210 will later be in fluid communication with as diaphragm aperture 211 (FIG. 9E), or with a spring gap 130 (FIG. 9E-2).

Figure 9F:
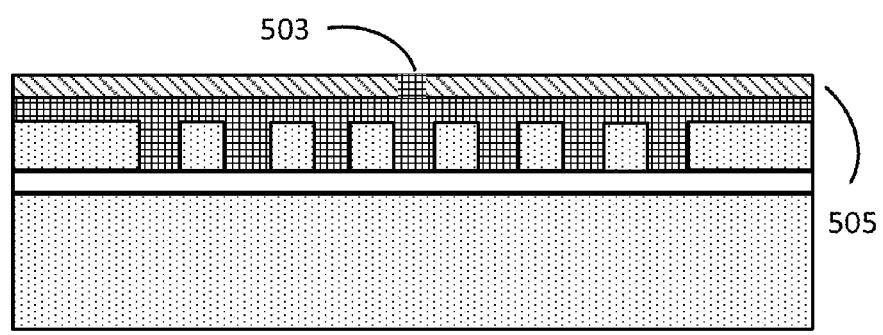

At step 806, the method 800 deposits additional sacrificial material into the seal aperture 210, such that additional sacrificial material (503) is contiguous with the previously-deposited sacrificial material 503 (FIG. 9F). The sacrificial material will present a surface on which a portion of the diaphragm 103 will next be added.

Figure 9G:
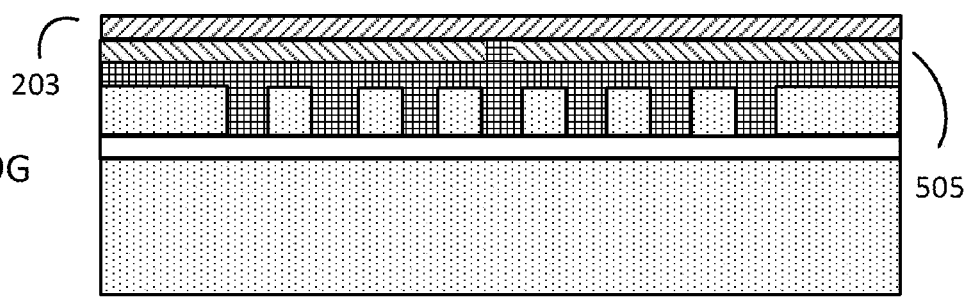
Figure 9H:
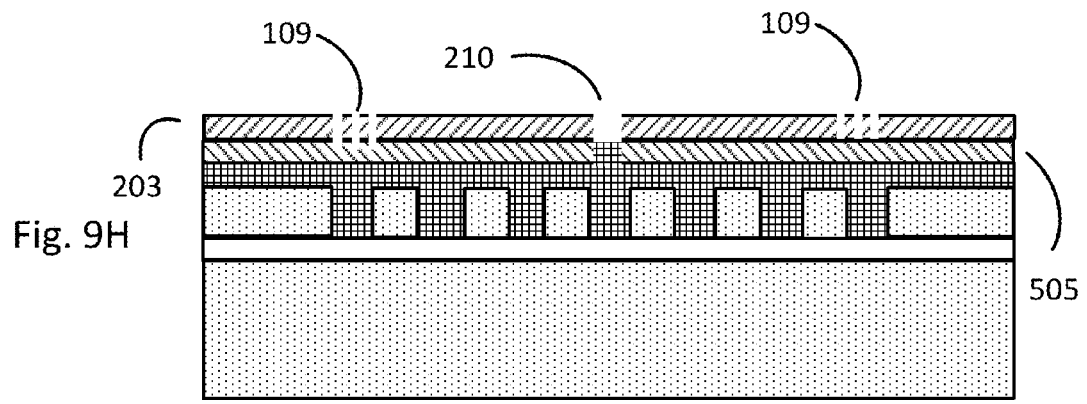

At step 807, the method 800 deposits a diaphragm layer 203 onto the sacrificial layer 201, and the exposed portion of the sacrificial material 503 as schematically illustrated in FIG. 9G. At step 808, the method 800 patterns the springs 109 and spring gap 130 into the diaphragm layer 203, so form the diaphragm 203 (FIG. 9H). If the microphone being fabricated includes a diaphragm aperture 211, then step 808 also includes etching that diaphragm aperture 211 into the diaphragm layer 203 (FIG. 9H), and the diaphragm aperture 211 is the equalization passage. Of course, if the microphone being fabricated will use the spring gap 130 as the equalization aperture, no diaphragm aperture 211 is etched at step 808, since the process of etching the spring gap 130 is performed such that the spring gap is above the seal aperture 210.

Figure 9I:
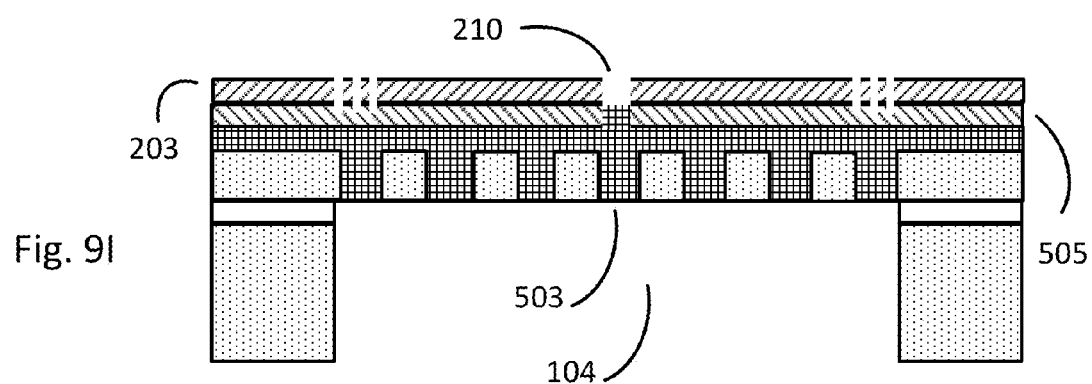
Figure 9J:
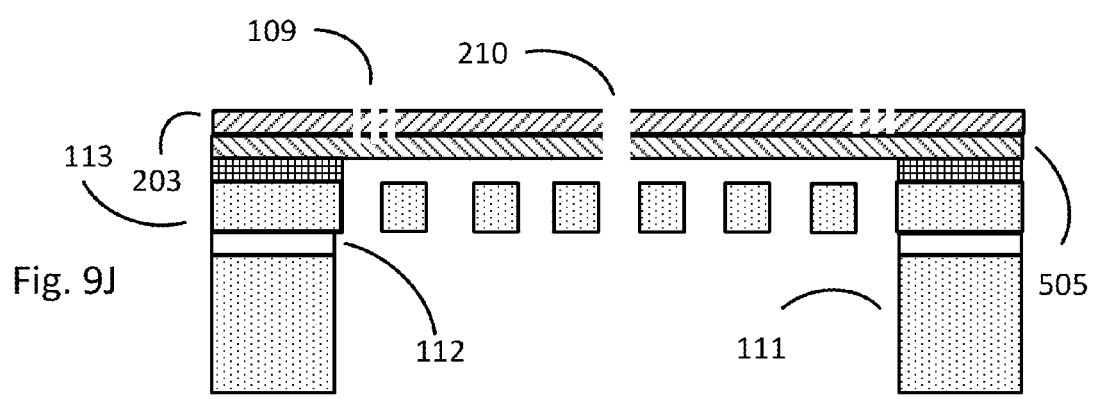

A backside cavity 104 is then formed in the substrate at step 809 (FIG. 9I).

Finally, the sacrificial material 503 (including the additional sacrificial material 503) is removed at step 810. Removal of the sacrificial material 503 includes removal of the all or substantially all of the sacrificial material 503 in the trenches 107, and between the backplate 102 and the seal layer 201, as well as in the seal aperture 210. Some of the sacrificial material 503 remains between the device layer 112 and the seal layer 505, and physically couples the device layer 112 and the seal layer 505. As a result, the diaphragm 103 is rendered movable with respect to the backplate 102. In other words, the diaphragm 103 is "released."

Figure 10A:
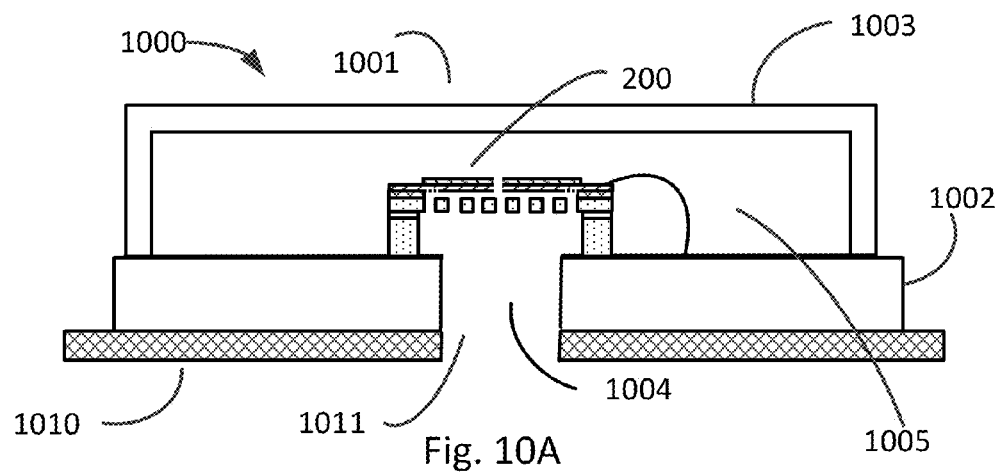
FIGS. 10A-10C schematically illustrate embodiments of packaged microphones.
Figure 10B:
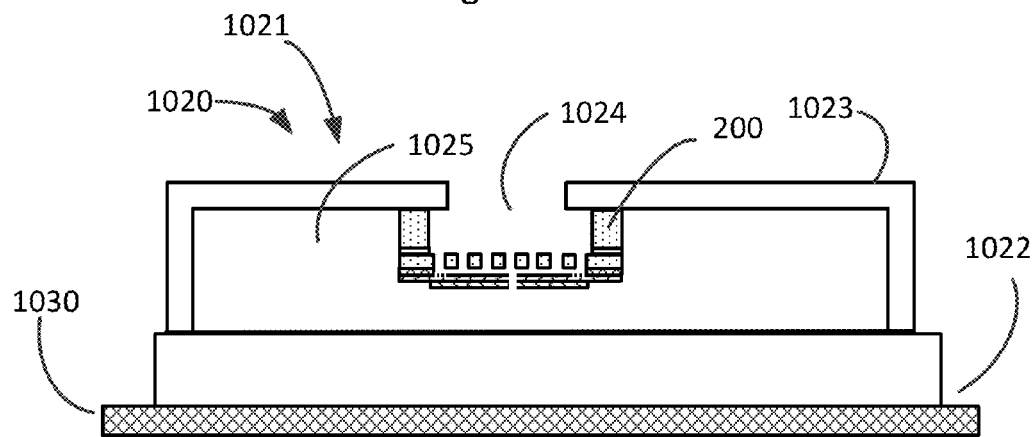

FIG. 10A and FIG. 10B schematically illustrate packaged microphones (1000, 1020). In these figures, the microphones are schematically illustrated as microphone 200, but could be any of a variety of embodiments that includes an equalization aperture (e.g., 213 or 214), such as microphones 230, 250 and 270, to name but a few.

In FIG. 10A, a package 1001 includes a substrate 1002 and a lid 1003. Substrate 1002 includes a substrate aperture 1004 extending through the substrate 1002, to allow an acoustic wave to pass through the substrate 1002 and impinge on the diaphragm 103 of the microphone 200. The substrate 1002 and lid 1003 form a hermetically sealed back volume 1005. As such, the equalization aperture 213 in microphone 200 provides the only passage by which air pressure may be equalized between the interior of the package (i.e., back volume 1005 and the interior surface 103A of the diaphragm 103) and the environment outside of the package 1000.

In FIG. 10A, the package 1001 is schematically illustrated as mounted on (or coupled to) an assembly substrate 1010. Assembly substrate 1010 may be a printed circuit board, or other assembly of which the packaged microphone 1000 is a part. The assembly substrate 1010 includes an aperture 1011 that is aligned with substrate aperture 1004 to facilitate the passage of an acoustic wave into the package 1001 from the environment outside of the package 1001.

FIG. 10B schematically illustrates an alternate embodiment of a packaged microphone 1020, including package 1021 having a substrate 1022 and lid 1023. In the embodiment 1020 of FIG. 10B, the lid 1023 includes an aperture 1024 to allow an acoustic wave to pass through the lid 1023 and impinge on the diaphragm 103 of the microphone 200, but the substrate 1022 does not include any aperture. In FIG. 10B, the package 1020 is schematically illustrated as mounted on (or coupled to) an assembly substrate 1030. Assembly substrate 1030 may be a printed circuit board, or other assembly of which the packaged microphone 1020 is a part.

Figure 10C:
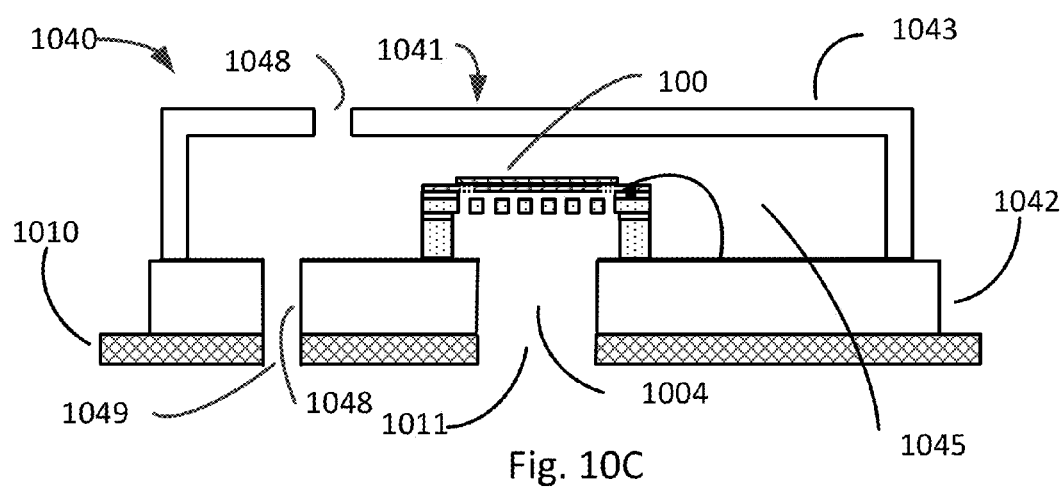

FIG. 10C schematically illustrates an alternate embodiment of a packaged microphone 1040. In FIG. 10A, a package 1041 includes a substrate 1002 and a lid 1003. Substrate 1042 includes a substrate aperture 1004 extending through the substrate 1042, to allow an acoustic wave to pass through the substrate 1042 and impinge on the diaphragm 103 of the microphone 100. The substrate 1042 and lid 1043 form a back volume 1045. At least one of the substrate 1042 and the lid 1043 includes a vent aperture 1048 to provide a passage by which air pressure may be equalized between the interior of the package (i.e., back volume 1045 and the interior surface 103A of the diaphragm 103) and the environment outside of the package 1040.

In FIG. 10C, the package 1041 is schematically illustrated as mounted on (or coupled to) an assembly substrate 1010. Assembly substrate 1010 may be a printed circuit board, or other assembly of which the packaged microphone 1040 is a part. The assembly substrate 1010 includes an aperture 1011 that is aligned with substrate aperture 1004 to facilitate the passage of an acoustic wave into the package 1001 from the environment outside of the package 1001. The assembly substrate 1010 also includes a second aperture 1049 aligned with the vent aperture 1048 in substrate 1042 to allow air to pass between the back volume 1045.

Various embodiments of the present inventions may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

Without limitation, potential subject matter that may be claimed (prefaced with the letter "P" so as to avoid confusion with the actual claims presented below) includes:

P1: A method of fabricating a microphone having a sealing layer, comprising:
  providing a substrate wafer having a surface;
  depositing a seal layer on the surface of the substrate;
  depositing a diaphragm layer on the seal layer;
  etching a diaphragm aperture, a spring gap and a plurality of springs into the diaphragm layer;
  etching a seal aperture into the seal layer such that the seal aperture is in fluid communication with the diaphragm aperture;
  depositing a layer of sacrificial material onto the diaphragm layer, the layer of sacrificial material coving the diaphragm layer and filling the spring gap, the diaphragm aperture and the seal aperture;
  forming a backplate on the sacrificial layer;
  etching a backside cavity in the substrate wafer;
  removing the sacrificial material to release the diaphragm such that the diaphragm is suspended by the springs and is movable relative to the backplate.

P10: A method of fabricating a microphone having a sealing layer, comprising:
  providing a substrate wafer having a surface;
  depositing a seal layer on the surface of the substrate;
  depositing a diaphragm layer on the seal layer;
  etching a spring gap and a plurality of springs into the diaphragm layer;
  etching a seal aperture into the seal layer such that the seal aperture is in fluid communication with the spring gap;
  depositing a layer of sacrificial material onto the diaphragm layer, the layer of sacrificial material coving the diaphragm layer and filling the spring gap and the seal aperture;
  forming a backplate on the sacrificial layer;
  etching a backside cavity in the substrate wafer;
  removing the sacrificial material to release the diaphragm such that the diaphragm is suspended by the springs and is movable relative to the backplate.

P20. A method of fabricating a microphone having a sealing layer, comprising:
  providing a substrate wafer having a surface;
  etching trenches into the surface of the substrate wafer;
  covering the surface of the substrate with a sacrificial material, the sacrificial material filling the trenches;
  depositing a diaphragm layer on the sacrificial material;
  etching a spring gap and springs into the diaphragm layer;
  adding additional sacrificial material within the spring gap such that the additional sacrificial material is contiguous with the sacrificial material;
  adding a sealing layer on the diaphragm, springs and added sacrificial material;
  etching a seal aperture in the sealing layer;
  etching a backside cavity in the substrate wafer to expose the sacrificial material; and
  removing the sacrificial material and the added sacrificial material to release the diaphragm such that the diaphragm is suspended by the springs and is movable relative to the backplate when the microphone is in operation.

P21. The method of fabricating a microphone of P20, further comprising:
  etching a diaphragm aperture through the diaphragm; and
  wherein adding additional sacrificial material within the spring gap further comprises adding additional sacrificial material within the diaphragm aperture such that the additional sacrificial material within the diaphragm aperture is contiguous with the sacrificial material.

P22. The method of fabricating a microphone of P21, wherein etching a seal aperture in the sealing layer comprises etching a seal aperture in the sealing layer such that the seal aperture is in fluid communication with the diaphragm aperture after the step of removing the sacrificial material and additional sacrificial material.

P23. The method of fabricating a microphone of P20, wherein etching a seal aperture in the sealing layer comprises etching a seal aperture in the sealing layer such that the seal aperture is in fluid communication with the spring gap after the step of removing the sacrificial material and additional sacrificial material.

Definitions. As used in this description and the accompanying claims, the following terms shall have the meanings indicated, unless the context otherwise requires:

A diaphragm region of a microphone includes a diaphragm and the springs that suspend the diaphragm from diaphragm suspension points, along with a gap between the diaphragm and the suspension points. Generally, a diaphragm region includes portions of a microphone through which air could flow from one side of the diaphragm to the other without having to pass around the microphone.

A sealing layer is a layer of material that prevents air from passing through the region of a microphone to which the sealing layer is applied. In some embodiments, a sealing layer prevents air from passing through any portion of the diaphragm region of a microphone. In other embodiments, a sealing layer may include an aperture (i.e., an area of the diaphragm region to which a sealing layer is not applied) that allows some air to pass from one side of a microphone diaphragm to the opposing side, so as to allow air pressure to equalize. For example, if a sealing layer is applied to a spring gap (e.g., the sealing layer spans the spring gap), the sealing layer prevents air from flowing through the spring gap, unless the sealing layer includes an aperture above the spring gap, in which case air may pass through the aperture and through a portion of the spring gap immediately adjacent to the aperture.

The embodiments of the inventions described above are intended to be merely exemplary; numerous variations and modifications will be apparent to those skilled in the art. All such variations and modifications are intended to be within the scope of the present inventions as defined in any appended claims.

What is claimed is:

1. A MEMS microphone comprising:
a substrate comprising a plurality of diaphragm suspension points;
a backplate;
a diaphragm having a top side and an opposing bottom side, the diaphragm defining a diaphragm plane, the diaphragm separated from the plurality of diaphragm suspension points by a spring gap in the diaphragm plane;
a plurality of springs within the diaphragm plane and within the spring gap, each of the plurality of springs coupled to the diaphragm and to a corresponding one of the plurality of diaphragm suspension points, such that the diaphragm is movably suspended from the plurality of diaphragm suspension points when the microphone is in operation, and such that the diaphragm is spaced from the backplate by a variable diaphragm gap; and
a sealing layer laminated on the diaphragm and spanning the spring gap, wherein the backplate and diaphragm form a variable capacitor of a microphone.

2. The MEMS microphone according to claim 1, wherein the sealing layer further comprises an equalization aperture configured to allow air flow from the top side of the diaphragm to the bottom side of the diaphragm, the equalization aperture having a cross-section in the plane of the diaphragm of not greater than 20 square micrometers.

3. The MEMS microphone according to claim 2, wherein the equalization aperture is disposed adjacent the spring gap, such air may flow from the top side of the diaphragm to the bottom side of the diaphragm through the spring gap.

4. The MEMS microphone according to claim 2, wherein:
the diaphragm further comprises a diaphragm aperture extending from the top side of the diaphragm to the bottom side of the diaphragm; and
the equalization aperture is aligned with the diaphragm aperture, such that air may flow from the top side of the diaphragm to the bottom side of the diaphragm through the diaphragm aperture.

5. The MEMS microphone according to claim 1, wherein the backplate is in the substrate, and the diaphragm is suspended parallel to the substrate.

6. The MEMS microphone according to claim 1, wherein the diaphragm is on the substrate, and the backplate is suspended parallel to the substrate.

7. A packaged microphone comprising:
a package base;
a package lid coupled to the package base, the package lid and package base forming an interior cavity, one of the package base and the package lid comprising an acoustic aperture;
a microphone mounted within the interior cavity, the microphone comprising:
a substrate comprising a backside cavity and a plurality of diaphragm suspension points, the backside cavity spanning the acoustic aperture;
a backplate suspended from the substrate and spanning the backside cavity;
a diaphragm region comprising a diaphragm suspended from the diaphragm suspension points, the diaphragm parallel to the backplate and spaced from the backplate by a variable diaphragm gap and separated from the plurality of diaphragm suspension points by a spring gap;
a sealing layer laminated on the diaphragm and spanning the spring gap, wherein the backplate and diaphragm form a variable capacitor of a microphone.

8. The packaged microphone of claim 7, wherein the sealing layer completely seals the diaphragm region, and wherein the microphone is mounted to the package base, and wherein one of the package base and the lid comprise an equalization aperture.

9. The packaged microphone of claim 8, wherein the package lid comprises the equalization aperture.

10. The packaged microphone of claim 8, wherein the package base comprises the equalization aperture.

11. The packaged microphone of claim 7, wherein the sealing layer completely seals the diaphragm region, and wherein the microphone is mounted to the package lid, and wherein one of the package base and the lid comprise an equalization aperture.

12. The packaged microphone of claim 11, wherein the package lid comprises the equalization aperture.

13. The packaged microphone of claim 11, wherein the package base comprises the equalization aperture.

14. The packaged microphone of claim 7, wherein:
the sealing layer comprises an equalization aperture in fluid communication with a passage through a diaphragm region, such that air may flow from one side of the diaphragm to another to equalize pressure on the diaphragm.

15. The packaged microphone of claim 14, wherein the passage is a spring gap.

16. The packaged microphone of claim 14, wherein the passage is a diaphragm aperture.

17. A method of fabricating a microphone having a sealing layer, comprising:
providing a substrate wafer having a surface;
etching trenches into the surface of the substrate wafer;
covering the surface of the substrate with a sacrificial material, the sacrificial material filling the trenches;

depositing a seal layer on the sacrificial material, the seal layer having a thickness of not greater than 500 nanometers;

etching a seal aperture in the seal layer;

adding additional sacrificial material within the seal aperture such that the additional sacrificial material is contiguous with the sacrificial material;

depositing a diaphragm layer on the seal layer;

etching a spring gap and springs into the diaphragm layer to define a diaphragm region in the diaphragm layer;

etching a backside cavity in the substrate wafer to expose the sacrificial material; and removing the sacrificial material and the added sacrificial material to release the diaphragm such that the diaphragm is suspended by the springs and is movable relative to the backplate, wherein diaphragm and backplate form a variable capacitor of a microphone, and the springs suspend the diaphragm when the microphone is in operation, and the seal layer seals the diaphragm region except at the location of the seal aperture.

18. The method of fabricating a microphone of claim 17, wherein etching a spring gap and springs into the diaphragm layer further comprises etching a diaphragm aperture in a location such that the diaphragm aperture will be in fluid communication with the seal aperture after removal of the sacrificial material and the additional sacrificial material.

19. The method of fabricating a microphone of claim 17, wherein the seal aperture has a cross-section of not greater than 20 square micrometers.

20. The method of fabricating a microphone of claim 17, wherein etching the spring gap comprises etching the spring gap such that the spring gap is in fluid communication with the seal aperture after the step of removing the sacrificial material and additional sacrificial material.

* * * * *